(12) United States Patent
Nakagawa et al.

(10) Patent No.: US 7,919,005 B2
(45) Date of Patent: Apr. 5, 2011

(54) DRY ETCHING METHOD, FINE STRUCTURE FORMATION METHOD, MOLD AND MOLD FABRICATION METHOD

(75) Inventors: Hideo Nakagawa, Shiga (JP); Masaru Sasago, Osaka (JP); Tomoyasu Murakami, Osaka (JP)

(73) Assignee: Panasonic Corporation, Osaka (JP)

( * ) Notice: Subject to any disclaimer, the term of this patent is extended or adjusted under 35 U.S.C. 154(b) by 790 days.

(21) Appl. No.: 11/659,109

(22) PCT Filed: May 23, 2006

(86) PCT No.: PCT/JP2006/310214
§ 371 (c)(1),
(2), (4) Date: Feb. 1, 2007

(87) PCT Pub. No.: WO2006/126520
PCT Pub. Date: Nov. 30, 2006

(65) Prior Publication Data
US 2009/0011065 A1 Jan. 8, 2009

(30) Foreign Application Priority Data

| May 24, 2005 | (JP) | 2005-151412 |
| May 24, 2005 | (JP) | 2005-151413 |
| May 24, 2005 | (JP) | 2005-151414 |
| Feb. 13, 2006 | (JP) | 2006-034852 |

(51) Int. Cl.
*C23F 1/00* (2006.01)
*H01L 21/302* (2006.01)

(52) U.S. Cl. .......................................... 216/58; 438/706
(58) Field of Classification Search ............... 438/710; 216/58
See application file for complete search history.

(56) References Cited

U.S. PATENT DOCUMENTS

| 5,298,112 A | 3/1994 | Hayasaka et al. |
| 5,650,059 A * | 7/1997 | Shumaker et al. ............ 205/640 |
| 5,772,905 A | 6/1998 | Chou |
| 5,814,238 A | 9/1998 | Ashby et al. |
| 6,015,976 A * | 1/2000 | Hatakeyama et al. ... 250/492.23 |
| 6,156,243 A | 12/2000 | Kosuga et al. |
| 6,168,737 B1 * | 1/2001 | Poco et al. .................... 264/129 |
| 6,358,428 B1 * | 3/2002 | Leverenz et al. .............. 216/39 |
| 6,420,095 B1 * | 7/2002 | Kawamura et al. ........... 430/313 |
| 2002/0142230 A1 * | 10/2002 | Yan et al. .......................... 430/5 |
| 2003/0024902 A1 | 2/2003 | Li et al. |
| 2004/0224504 A1 | 11/2004 | Gadgil |
| 2005/0112901 A1 | 5/2005 | Ji et al. |

FOREIGN PATENT DOCUMENTS

JP 01-098229 4/1989

(Continued)

OTHER PUBLICATIONS

Chou, S. Y., et al. "Imprint of sub-25nm vias and trenches in polymers" Appl. Phys. Lett., Nov. 20, 1995, vol. 67, No. 21, pp. 3114-3116.

(Continued)

*Primary Examiner* — Nadine G Norton
*Assistant Examiner* — Patti Lin
(74) *Attorney, Agent, or Firm* — McDermott Will & Emery LLP

(57) ABSTRACT

A WC substrate 7 is etched by using plasma 50 generated from a gas including a chlorine atom.

18 Claims, 18 Drawing Sheets

FOREIGN PATENT DOCUMENTS

| | | |
|---|---|---|
| JP | 02-094520 | 4/1990 |
| JP | 06-029253 | 2/1994 |
| JP | 06-188225 | 7/1994 |
| JP | 07-218739 | 8/1995 |
| JP | 07-221074 | 8/1995 |
| JP | 07-263426 | 10/1995 |
| JP | 07-335624 | 12/1995 |
| JP | 08-339987 | 12/1996 |
| JP | 10-337734 | 12/1998 |
| JP | 2002-025986 | 1/2002 |
| JP | 2004-039777 | 2/2004 |
| JP | 2004-268331 | 9/2004 |
| JP | 2005-026444 | 1/2005 |

OTHER PUBLICATIONS

United States Office Action issued in U.S. Appl. No. 11/475,173 dated Nov. 27, 2009.

United States Office Action issued in U.S. Appl. No. 11/475,173 dated Jan. 7, 2010.

United States Office Action issued in U.S. Appl. No. 11/659,107 dated Dec. 31, 2009.

* cited by examiner

MIXING RATIO OF OXYGEN GAS TO HYDROGEN IODIDE GAS

DRY ETCHING METHOD, FINE STRUCTURE FORMATION METHOD, MOLD AND MOLD FABRICATION METHOD

RELATED APPLICATIONS

This application is a national phase of PCT/JP2006/310214 filed May 23, 2006, which claims priority from Japanese Application Nos. JP 2005-151412, JP 2005-151413, and JP 2005-151414 each of which was filed May 24, 2005, as well as JP 2006-034852 filed Feb. 13, 2006. The disclosures of all listed Applications are incorporated by reference herein. The benefit of the filing and priority dates of the International and Japanese Applications is respectfully requested.

TECHNICAL FIELD

The present invention relates to a microprocessing technique for a substance including tungsten (W) and carbon (C), a mold including, as composing elements, a substance including tungsten (W) and carbon (C) and a method for fabricating the mold. The present invention further relates to a method for suitably fabricating a molding die with a fine pattern shape, which employs, as a molding material, a hard metal including tungsten and carbon as principal components.

BACKGROUND ART

Recently, in accordance with the spread of internet, there are increasing demands for an optical communication system as high bit rate communication infrastructure. In order to introduce the high bit rate communication system into general homes and make it more popular, a technique to realize a low cost of an optical circuit component included in the optical communication system is necessary.

An optical waveguide, that is, a principal composing element of the optical circuit component, can be generally fabricated by forming a desired groove pattern on a glass substrate by a lithography technique and a dry etching technique typified by semiconductor process. Since an expensive fabrication apparatus is necessary in this method, however, it is disadvantageously difficult to reduce the cost of the optical waveguide. Therefore, as described in Patent Document 1, attention is now being paid to a method for forming a desired optical waveguide or the like on a glass by pressing a mold having a desired concavo-convex structure against the surface of a softened material of glass. In this method, a desired optical waveguide can be mass produced when a mold is prepared, and hence, the optical circuit component can be inexpensively provided. However, since this method should be performed at a high temperature and a high pressure, the mold needs to have heat resistance, rigidity and durability. A material satisfying this necessity is a WC alloy including tungsten (W) and carbon (C), that is, hard metals, as principal components.

A method for forming a fine pattern on the surface of a WC alloy is a metal machining method using a diamond cutting tool disclosed in Patent Document 1, but the dimension of a concavo-convex pattern cut on a mold by this machining method is several microns or more and this machining method is also restricted in processing uniformity. As a method for realizing processing of a concavo-convex pattern not only in the dimension range realized by the metal machining method using a diamond cutting tool but also with a concavo-convex dimension of 1 μm or less, a microprocessing technique employing the lithography technique and the dry etching technique is effective. With this technique, not only a fine concavo-convex pattern can be formed but also processing variation is small and a mold can be fabricated at a lower cost than in the metal machining method using a diamond cutting tool.

As a dry etching technique for a WC alloy, Patent Document 2 discloses that the WC alloy can be dry etched by using $CF_4$ or $SF_6$.

Now, the conventional dry etching method will be described with reference to FIGS. 6(a) and 6(b). As shown in FIG. 6(a), a reaction chamber 101 in which a reduced pressure can be kept is provided with a gas inlet 102 and a gas outlet 103. Also, a plasma generator 104 for changing a gas supplied through the gas inlet 102 into plasma is provided in an upper portion of the reaction chamber 101. Furthermore, an electrode 106 on which a target material, specifically, a WC alloy substrate or a substrate having a WC alloy in its surface portion (hereinafter both referred to as a WC substrate 107), is placed is provided on an insulator 105 in a lower portion of the reaction chamber 101. An RF (radio frequency) power source 108 for applying a bias voltage to the electrode 106 is provided outside the reaction chamber 101.

Next, the operation of the etching system shown in FIG. 6(a) will be described by exemplifying the case where $CF_4$ is used as an etching gas. As shown in FIG. 6(a), $CF_4$ is introduced through the gas inlet 102 into the reaction chamber 101, and plasma 150 of the $CF_4$ is generated by the plasma generator 104 and at the same time, RF bias is applied to the WC substrate 107 by the RF power source 108. As a result, radicals 109 of C, F or $CF_n$ (wherein n=1 though 4) and their ions 110 are produced in the plasma 150. At this point, in the plasma 150 used for the dry etching, the proportions in the number of atoms or molecules produced by the plasma 150 are generally in the order of $F>CF_n>>C$. The radicals 109 are isotropically diffused to reach the WC substrate 107, but the ions 110 are accelerated between the plasma 150 and the WC substrate 107 and hence enter the WC substrate 107 substantially vertically. In particular, in the case where a $F^+$ ion or a $CF^{n+}$ ion including a F atom enters the WC substrate 107, a bond between W and C is cut and W is released in the form of $WF_x$ (wherein x=1 through 6). On the other hand, C is re-released in the form of $CF_y$ (wherein y=1 through 4).

The etching reaction caused on the surface of the WC substrate will now be described in more detail with reference to FIG. 6(b). As shown in FIG. 6(b), a resist pattern 112 is formed on a WC substrate 111. When the WC substrate 111 is etched with ions 113a and 113b of $F^+$ or $CF^+$ by using the resist pattern 112 as a mask, the W included in the WC substrate 111 is released in the form of $WF_x$ (wherein x=1 through 6) 114. At this point, the side face of a pattern of the WC substrate 111 obtained through the etching is in a bowing shape for the following reason:

In the etching of the WC substrate 111, most ions enter the WC substrate 111 substantially vertically like the ion 113a, but since ions basically have energy spread (an ion energy angular distribution), some ions enter the WC substrate 111 obliquely like the ion 113b. Accordingly, the anisotropic (vertical) etching of the WC substrate 111 by using the resist pattern 112 as the etching mask is realized by the ion 113a vertically entering the WC substrate 111. However, due to the impact caused by the ion 113b obliquely entering the WC substrate 111, the side face of the pattern of the WC substrate 111 is etched, resulting in the bowing shape as shown in FIG. 6(b).

Next, a conventional fine structure formation method for a WC alloy and a mold fabrication method by employing the same will be described with reference to FIGS. 7(a) through 7(d).

As shown in FIG. 7(a), a WC alloy substrate 121 is prepared, and a resist pattern 122 is formed on the WC alloy substrate 121 as shown in FIG. 7(b). The resist pattern 122 is generally formed by the lithography technique. Next, as shown in FIG. 7(c), a pattern is transferred onto the WC alloy substrate 121 by using the resist pattern 122 as a mask. At this point, the pattern transfer is performed by the dry etching technique.

When the aforementioned conventional dry etching technique is employed, since ions 123 entering the WC alloy substrate 121 from plasma have the energy spread, there are not only a component A vertically entering the surface of the WC alloy substrate 121 but also components obliquely entering the surface at an angle, namely, obliquely entering components B and C. Therefore, since the side face of a pattern of the WC alloy substrate 121 is etched by such obliquely entering ions, the etched cross-section is in what is called a bowing shape as shown in FIG. 7(c).

Then, the resist pattern 122 is removed through ashing, and the resultant substrate is cleaned. Thus, a mold made of the WC alloy substrate 121 having a fine concavo-convex structure in its surface and inside portions is obtained as shown in FIG. 7(d).

A conventional processing technique by using a mold is a nano-imprint method such as nano-imprint lithography proposed by S. Y. Chou et al. (see, for example, Patent Document 3 and Non-patent Document 1). In the nano-imprint method, a mold is pressed against a resist thin film formed on a semiconductor wafer for forming a fine resist pattern, and this method is currently under development for forming a fine pattern of a nano order as the minimum dimension. In a fine structure portion of a conventional mold for use in the nano-imprint method, a $SiO_2$ film or a $Si_3N_4$ film that can be easily processed is used.

Patent Document 1: Japanese Patent No. 3152831
Patent Document 2: Japanese Laid-Open Patent Publication No. H1-98229
Patent Document 3: U.S. Pat. No. 5,772,905
Non-patent Document 1: Stephen Y. Chou, et al., Appl. Phys. Lett., Vol. 67, 1995, pp. 3114-3116
Patent Document 4: Japanese Laid-Open Patent Publication No. H2-94520

DISCLOSURE OF INVENTION

Problems to be Solved by the Invention

In the conventional dry etching method using $CF_4$ or $SF_6$, however, not only the bottom of a pattern but also the side face of the pattern is etched so that the side face is formed in a bowing shape as described above, and hence, a vertical etching shape cannot be attained and high performance processing cannot be performed. Furthermore, the processing by the conventional dry etching method has a problem that a highly precise fine structure cannot be formed on and inside a WC alloy. As a result, there is a serious problem that a WC alloy mold with a highly precise fine structure cannot be fabricated.

In consideration of the aforementioned conventional disadvantage and problem, an object of the invention is providing a dry etching method for a WC alloy that can realize a vertical etching shape by preventing the side face of a pattern from being etched. Another object of the invention is providing a fine structure formation method for forming a highly precise fine structure in a vertical shape on and inside a WC alloy. Still another object of the invention is providing a WC alloy mold with a highly precise fine structure and a method for fabricating the same.

Means for Solving the Problems

In order to achieve the objects, a dry etching method according to this invention includes the step of etching a substance including tungsten and carbon by using plasma generated from a gas including a chlorine atom.

In the dry etching method of this invention, it is possible to perform etching processing for realizing, on and within the substance including tungsten and carbon, a highly precise vertical shape or a highly precise downward tapered shape free from a bowing shape. Examples of the substance including tungsten and carbon are a WC alloy and a substance including W and C as principal components (in which the total content of W and C is 50 atomic % or more).

Preferably, in the dry etching method of the invention, the gas including a chlorine atom includes a chlorine molecule, a hydrogen chloride molecule, a boron trichloride molecule, or a mixture of two or more thereof. With this method, handling of gas supply and the like can be facilitated because these molecules are relatively small in weight, and concurrently chlorine can be produced efficiently through plasma discharge.

Preferably, in the dry etching method of the invention, the plasma is generated from a mixed gas of the gas including a chlorine atom and a gas including an oxygen atom. With this method, the effect of adding oxygen can increase the etching rate of the substance including tungsten and carbon. In this case, preferably, the gas including an oxygen atom includes an oxygen molecule, a nitrogen oxide molecule, a sulfur oxide molecule, a carbon oxide molecule, or a mixture of two or more thereof. With this method, oxygen can be supplied efficiently.

Preferably, in the dry etching method of the invention, the gas including a chlorine atom contains an oxygen atom. With this method, the effect of adding oxygen can increase the etching rate of the substance including tungsten and carbon.

Preferably, in the dry etching method of the invention, the plasma is generated from a mixed gas of the gas including a chlorine atom and an inert gas. With this method, the plasma discharge can be further stabilized by an inert gas effect, and hence, what is called a process window (i.e., an applicable range of process conditions) can be easily increased.

In the dry etching method of the invention, the plasma may be generated from a mixed gas of the gas including a chlorine atom and a gas including a halogen atom other than a chlorine atom. Also, the gas including a halogen atom may be a gas including a fluorine atom, a gas including a bromine atom, a gas including an iodine atom, or a mixed gas of two or more thereof. To be more specific, in the case of mixing a gas including a fluorine atom, the effect of fluorine can increase the etching rate without losing the capability of forming a vertical shape by chlorine. In the case of mixing a gas including a bromine atom or a gas including an iodine atom, the effect of bromine or iodine can enhance the effect of protecting the side face of a portion to be etched, so that not only an etching for forming a vertical etching shape but also an etching for forming a downward tapered etching shape can be performed.

In the dry etching method of the invention, the gas including a chlorine atom may contain a fluorine atom. Specifically, $ClF_3$, $CClF_3$, $CCl_3F$, $CCl_2F_2$, $ClF_2Br$, $ClF_2I$, or the like may be employed.

In the dry etching method of the invention, the gas including a chlorine atom may contain a halogen atom other than a chlorine atom. Specifically, $ClF_3$, $CClF_3$, $CCl_3F$, $CCl_2F_2$, $ICl$, $ClF_2Br$, $ClF_2I$, $BrCl$, or the like may be employed.

A fine structure formation method according to the invention includes the steps of: forming a mask pattern on a substance including tungsten and carbon; and etching, with the mask pattern used, the substance by using plasma generated from a gas including a chlorine atom.

With the fine structure formation method of the invention, etching processing can be conducted which can realize a highly precise vertical shape or a highly precise downward tapered shape free from a bowing shape.

Preferably, in the fine structure formation method of the invention, the gas including a chlorine atom includes a chlorine molecule, a hydrogen chloride molecule, a boron trichloride molecule, or a mixture of two or more thereof. With this method, handling of gas supply and the like can be facilitated because these molecules are relatively small in weight, and concurrently chlorine can be produced efficiently through plasma discharge. Therefore, the substance including tungsten and carbon can be subjected to a more inexpensive processing for forming a highly precise vertical shape.

Preferably, in the fine structure formation method of the invention, the plasma is generated from a mixed gas of the gas including a chlorine atom and a gas including an oxygen atom. With this method, the effect of adding oxygen can increase the etching rate of the substance including tungsten and carbon, so that the substance can be subjected to a rapid processing for forming a highly precise vertical shape. In this case, preferably, the gas including an oxygen atom includes an oxygen molecule, a nitrogen oxide molecule, a sulfur oxide molecule, a carbon oxide molecule, or a mixture of two or more thereof. With this method, oxygen can be supplied efficiently, so that the substance including tungsten and carbon can be subjected to a stable, rapid processing for forming a highly precise vertical shape.

Preferably, in the fine structure formation method of the invention, the gas including a chlorine atom contains an oxygen atom. With this method, the effect of adding oxygen can increase the etching rate of the substance including tungsten and carbon, so that the substance can be subjected to a rapid processing for forming a highly precise vertical shape.

Preferably, in the fine structure formation method of the invention, the plasma is generated from a mixed gas of the gas including a chlorine atom and an inert gas. With this method, the plasma discharge can be further stabilized by an inert gas effect, so that the substance including tungsten and carbon can be subjected to a stable processing for forming a highly precise vertical shape.

In the fine structure formation method of the invention, the plasma may be generated from a mixed gas of the gas including a chlorine atom and a gas including a halogen atom other than a chlorine atom. Also, the gas including a halogen atom may be a gas including a fluorine atom, a gas including a bromine atom, a gas including an iodine atom, or a mixed gas of two or more thereof. To be more specific, in the case of mixing a gas including a fluorine atom, the effect of fluorine can increase the etching rate without losing the capability of forming a vertical shape by chlorine, so that the substance including tungsten and carbon can be subjected to a more rapid processing for forming a highly precise vertical shape. In the case of mixing a gas including a bromine atom or a gas including an iodine atom, the effect of bromine or iodine can enhance the effect of protecting the side face of a portion to be etched, so that not only a highly precise processing for forming a vertical etching shape but also a highly precise processing for forming a downward tapered etching shape can be conducted.

In the fine structure formation method of the invention, the gas including a chlorine atom may contain a fluorine atom. Specifically, $ClF_3$, $CClF_3$, $CCl_3F$, $CCl_2F_2$, $ClF_2Br$, $ClF_2I$, or the like may be employed.

In the fine structure formation method of the invention, the gas including a chlorine atom may contain a halogen atom other than a chlorine atom. Specifically, $ClF_3$, $CClF_3$, $CCl_3F$, $CCl_2F_2$, $ICl$, $ClF_2Br$, $ClF_2I$, $BrCl$, or the like may be employed.

A mold fabrication method according to the invention includes the step of processing, by using plasma generated from a gas including a chlorine atom, a substance including tungsten and carbon to fabricate a mold.

In the mold fabrication method of the invention, since the mold fabrication method employs the dry etching method of the invention, a mold made of a substance including tungsten and carbon and having a fine concavo-convex pattern with a vertical or downward tapered cross-section can be fabricated.

Preferably, in the mold fabrication method of the invention, the gas including a chlorine atom includes a chlorine molecule, a hydrogen chloride molecule, a boron trichloride molecule, or a mixture of two or more thereof. With this method, handling of gas supply and the like can be facilitated because these molecules are relatively small in weight, and concurrently chlorine can be produced efficiently through plasma discharge. Therefore, a mold having a fine concavo-convex pattern with a side face in a highly precise vertical shape can be fabricated more inexpensively.

Preferably, in the mold fabrication method of the invention, the plasma is generated from a mixed gas of the gas including a chlorine atom and a gas including an oxygen atom. With this method, the effect of adding oxygen can increase the etching rate of the substance including tungsten and carbon, so that a mold having a fine concavo-convex pattern with a side face in a highly precise vertical shape can be fabricated rapidly. In this case, preferably, the gas including an oxygen atom includes an oxygen molecule, a nitrogen oxide molecule, a sulfur oxide molecule, a carbon oxide molecule, or a mixture of two or more thereof. With this method, oxygen can be supplied efficiently, so that a mold having a fine concavo-convex pattern with a side face in a highly precise vertical shape can be fabricated stably and rapidly.

Preferably, in the mold fabrication method of the invention, the gas including a chlorine atom contains an oxygen atom. With this method, the effect of adding oxygen can increase the etching rate of the substance including tungsten and carbon, so that a mold having a fine concavo-convex pattern with a side face in a highly precise vertical shape can be fabricated rapidly.

Preferably, in the mold fabrication method of the invention, the plasma is generated from a mixed gas of the gas including a chlorine atom and an inert gas. With this method, the plasma discharge is further stabilized by an inert gas effect, so that a mold having a fine concavo-convex pattern with a side face in a highly precise vertical shape can be fabricated more stably.

In the mold fabrication method of the invention, the plasma may be generated from a mixed gas of the gas including a chlorine atom and a gas including a halogen atom other than a chlorine atom. Also, the gas including a halogen atom may be a gas including a fluorine atom, a gas including a bromine atom, a gas including an iodine atom, or a mixed gas of two or more thereof. To be more specific, in the case of mixing a gas including a fluorine atom, the effect of fluorine can increase the etching rate without losing the capability of forming a vertical shape by chlorine, so that a mold having a fine concavo-convex pattern with a side face in a highly precise vertical shape can be fabricated more rapidly. In the case of mixing a gas including a bromine atom or a gas including an iodine atom, the effect of bromine or iodine can enhance the effect of protecting the side face of a portion to be etched, so that not only a mold having a fine concavo-convex pattern with a side face in a highly precise vertical shape but also a mold having a fine concavo-convex pattern with a side face in a highly precise downward tapered shape can be fabricated.

In the mold fabrication method of the invention, the gas including a chlorine atom may contain a fluorine atom. Specifically, $ClF_3$, $CClF_3$, $CCl_3F$, $CCl_2F_2$, $ClF_2Br$, $ClF_2I$, or the like may be employed.

In the mold fabrication method of the invention, the gas including a chlorine atom may contain a halogen atom other than a chlorine atom. Specifically, $ClF_3$, $CClF_3$, $CCl_3F$, $CCl_2F_2$, $ICl$, $ClF_2Br$, $ClF_2I$, $BrCl$, or the like may be employed.

A mold according to the invention is fabricated by processing a substance including tungsten and carbon by using plasma generated from a gas including a chlorine atom.

In the mold of the invention, since the mold is fabricated by employing the dry etching method of the invention, a mold made of a substance including tungsten and carbon and having a fine concavo-convex pattern with a vertical or downward tapered cross-section can be provided.

Preferably, in the mold of the invention, the gas including a chlorine atom includes a chlorine molecule, a hydrogen chloride molecule, a boron trichloride molecule, or a mixture of two or more thereof. With this method, handling of gas supply and the like can be facilitated because these molecules are relatively small in weight, and concurrently chlorine can be produced efficiently through plasma discharge. Therefore, a mold having a fine concavo-convex pattern with a side face in a highly precise vertical shape can be provided more inexpensively.

Preferably, in the mold of the invention, the plasma is generated from a mixed gas of the gas including a chlorine atom and a gas including an oxygen atom. With this method, the effect of adding oxygen can increase the etching rate of the substance including tungsten and carbon, so that a mold having a fine concavo-convex pattern with a side face in a highly precise vertical shape can be fabricated and provided rapidly. In this case, preferably, the gas including an oxygen atom includes an oxygen molecule, a nitrogen oxide molecule, a sulfur oxide molecule, a carbon oxide molecule, or a mixture of two or more thereof. With this method, oxygen can be supplied efficiently, so that a mold having a fine concavo-convex pattern with a side face in a highly precise vertical shape can be fabricated and provided stably and rapidly.

Preferably, in the mold of the invention, the gas including a chlorine atom contains an oxygen atom. With this method, the effect of adding oxygen can increase the etching rate of the substance including tungsten and carbon, so that a mold having a fine concavo-convex pattern with a side face in a highly precise vertical shape can be fabricated and provided rapidly.

Preferably, in the mold of the invention, the plasma is generated from a mixed gas of the gas including a chlorine atom and an inert gas. With this method, the plasma discharge is further stabilized by an inert gas effect, so that a mold having a fine concavo-convex pattern with a side face in a highly precise vertical shape can be fabricated and provided more stably.

In the mold of the invention, the plasma may be generated from a mixed gas of the gas including a chlorine atom and a gas including a halogen atom other than a chlorine atom. Also, the gas including a halogen atom may be a gas including a fluorine atom, a gas including a bromine atom, a gas including an iodine atom, or a mixed gas of two or more thereof. To be more specific, in the case of mixing a gas including a fluorine atom, the effect of fluorine can increase the etching rate without losing the capability of forming a vertical shape by chlorine, so that a mold having a fine concavo-convex pattern with a side face in a highly precise vertical shape can be fabricated and provided more rapidly. In the case of mixing a gas including a bromine atom or a gas including an iodine atom, the effect of bromine or iodine can enhance the effect of protecting the side face of a portion to be etched, so that not only a mold having a fine concavo-convex pattern with a side face in a highly precise vertical shape but also a mold having a fine concavo-convex pattern with a side face in a highly precise downward tapered shape can be provided.

In the mold of the invention, the gas including a chlorine atom may contain a fluorine atom. Specifically, $ClF_3$, $CClF_3$, $CCl_3F$, $CCl_2F_2$, $ClF_2Br$, $ClF_2I$, or the like may be employed.

In the mold of the invention, the gas including a chlorine atom may contain a halogen atom other than a chlorine atom. Specifically, $ClF_3$, $CClF_3$, $CCl_3F$, $CCl_2F_2$, $ICl$, $ClF_2Br$, $ClF_2I$, $BrCl$, or the like may be employed.

Another dry etching method according to the invention includes the step of etching a molding material by using plasma radicals generated from an etching gas, the molding material being made of a hard metal including tungsten and carbon as principal components, the etching gas being made by mixing a first gas including an iodine atom, a chlorine atom, or a bromine atom, a second gas made of an inactive gas, and a third gas made of an oxygen gas.

Another molding die (mold) fabrication method according to the invention includes the steps of: forming an etching mask on the surface of a molding material, the etching mask having a predetermined pattern shape, the molding material being made of a hard metal including tungsten and carbon as principal components; and dry etching the molding material by using plasma radicals generated from an etching gas to form a convex portion associated with the etching mask, the etching gas being made by mixing a first gas including an iodine atom, a chlorine atom, or a bromine atom, a second gas made of an inactive gas, and a third gas made of an oxygen gas.

Preferably, in another said dry etching method and another said molding die fabrication method according to the invention, in the etching gas, the first gas and the third gas are mixed at a mixing ratio of the third gas to the first gas of from 0.15 to 0.6 inclusive.

In another said dry etching method and another said molding die fabrication method according to the invention, if the first gas is a gas including an iodine atom, the first gas is preferably a hydrogen iodide gas or trifluoroiodomethane. If the first gas is a gas including a chlorine atom, the first gas is preferably a chlorine gas or a boron trichloride gas. If the first gas is a gas including a bromine atom, the first gas is a bromine gas or a hydrogen bromide gas.

In another said dry etching method and another said molding die fabrication method according to the invention, the second gas is preferably argon.

Technical Advantages

In the dry etching method according to the invention, $WCl_x$ (x=1 through 6) with a lower volatility than $WF_x$ (x=1 through 6) produced by the conventional dry etching method with $CF_4$ or $SF_6$ is produced from the surface of the etched portion.

Thus, some amount of the produced $WCl_x$ is adsorbed again onto the side face of a pattern of a substance (a substance including tungsten and carbon, such as a WC alloy) being etched. This $WCl_x$ readsorption produces a sidewall protecting film, which blocks an etching reaction caused by the impact of an ion entering the side face of the pattern. Accordingly, a vertical etching shape in cross-section can be realized.

Furthermore, in the dry etching method according to the invention, a gas including fluorine is mixed into a gas including chlorine. Thereby, with a sidewall protecting film of low volatile $WCl_x$ (x=1 through 6) formed on the side face of the pattern, a bottom portion of the pattern can be etched efficiently by not only chlorine but also fluorine. Therefore, a more rapid etching for forming a vertical shape can be performed.

Moreover, in the dry etching method according to the invention, by mixing a gas including bromine or a gas including iodine into the gas including chlorine, $WBr_x$ (x=1 through 6) or $WI_x$ (x=1 through 6) with a lower volatility than $WCl_x$ (x=1 through 6) is produced from the surface being etched. Thereby, as compared with the case where only $WCl_x$ is produced, a sidewall protecting film with a larger thickness can be formed. Accordingly, not only an etching for forming a vertical shape but also an etching for forming a downward tapered shape can be realized.

In the fine structure formation method according to the invention, a fine concavo-convex pattern with a vertical cross-section or a downward tapered cross-section can be formed on and within a substance including tungsten and carbon.

In the mold fabrication method according to the invention, a mold made of a substance including tungsten and carbon and having a fine concavo-convex pattern with a vertical cross-section or a downward tapered cross-section can be fabricated.

In the mold according to the invention, a mold made of a substance including tungsten and carbon and having a fine concavo-convex pattern with a vertical cross-section or a downward tapered cross-section can be provided.

In any of the dry etching method, the fine structure formation method, the mold fabrication method and the mold of this invention, even when the substance including tungsten and carbon further includes nitrogen (N), the same effects as described above can be attained. In other words, when the invention is applied to a WCN alloy, a WNC alloy or the like, the same effects can be attained.

In another said dry etching method and another said molding die fabrication method according to the invention, use of a gas including an iodine atom, a chlorine atom, or a bromine atom as a first gas of an etching gas dramatically improves the etching rate as compared with the case of using a fluorine-based gas. In addition to this, by further mixing an oxygen gas into the etching gas, the etching rate is further improved. Thus, even in the case where the etching depth is set at a relatively large value of, for example, approximately 10 μm, etching processing can be completed in a short time. Therefore, during the period of time until the etching processing is completed, the cross-section of the etching mask can be kept in its initial rectangular shape without causing a change in the shape of the etching mask due to side etching, and the amount of an etching compound produced during the etching processing can be suppressed. A second gas mixed as an inactive gas in the etching gas effectively removes, by sputtering, an etching compound produced by the etching on the surface of the molding material. As described above, even in the case where as a fine pattern, a convex portion having a relatively great height of, for example, approximately 10 μm is formed on a base, a desired rectangular cross-section whose side face of the formed convex portion is exactly perpendicular to the base can be provided. Furthermore, removal of an etching compound by the second gas decreases the roughness of the etched surface, so that a molding die with a desired shape can be fabricated with high precision. Moreover, the etching time is significantly reduced. Thereby, a molding die can be fabricated with high productivity and thus the fabrication cost thereof can be reduced.

In another said dry etching method and another said molding die fabrication method according to the invention, the etching rate of a molding material including tungsten and carbon as principal components depends on the mixing ratio of an oxygen gas as a third gas to a first gas including an iodine atom, chlorine atom, or a bromine atom. Therefore, when the mixing ratio of the third gas to the first gas is set within the range of 0.15 to 0.6 inclusive, a high etching rate can be obtained. To be more specific, in the case where the first gas is a gas including an iodine atom, a high etching rate of about 300 nm or more per minute can be obtained. In the case where the first gas is a gas including a chlorine atom or a bromine atom, a high etching rate of about 150 to 200 nm per minute can be obtained. On the other hand, in the case of an etching using a fluorine-based gas as an etching gas, for example, an etching time as long as about 200 minutes is required to perform etching to reach a depth of 10 μm. Accordingly, as compared with this case, the etching time required to reach a desired etching depth can be significantly reduced.

Particularly, in another said dry etching method and another said molding die fabrication method according to the invention, when the mixing ratio of an oxygen gas as the third gas to the first gas including an iodine atom, a chlorine atom, or a bromine atom is set at 0.3, a maximum etching rate can be obtained. To be more specific, if the first gas is a gas including an iodine atom, the etching rate has a maximum value of about 500 nm per minute, thereby enabling about 10 μm-deep etching for 20 minutes. If the first gas is a gas including a chlorine atom, the etching rate has a maximum value of about 350 nm per minute, thereby enabling about 7 μm-deep etching for 20 minutes. If the first gas is a gas including a bromine atom, the etching rate has a maximum value of about 300 nm per minute, thereby enabling about 6 μm-deep etching for 20 minutes. As described above, the mixing ratio of an oxygen gas as the third gas to the first gas including an iodine atom, a chlorine atom, or a bromine atom is set at 0.3, whereby the etching time required to reach a desired etching depth can be reduced more significantly.

In another said dry etching method and another said molding die fabrication method according to the invention, if the first gas is a gas including an iodine atom and a hydrogen iodide gas or trifluoroiodomethane is used as the first gas, a stable dry etching can be performed because these gases are gasified easily.

In another said dry etching method and another said molding die fabrication method according to the invention, if the first gas is a gas including a chlorine atom and a chlorine gas or a boron trichloride gas is used as the first gas, a stable dry etching can be performed because these gases are gasified easily.

In another said dry etching method and another said molding die fabrication method according to the invention, if the first gas is a gas including a bromine atom and a bromine gas or a hydrogen bromide gas is used as the first gas, a stable dry etching can be performed because these gases are gasified easily.

In another said dry etching method and another said molding die fabrication method according to the invention, if an inactive gas as the second gas is argon, a compound produced through etching can be efficiently removed through sputtering even though the molding material is made of a hard metal including tungsten and carbon as principal components. Moreover, an argon gas has an advantage of a low cost.

Figure 1A:
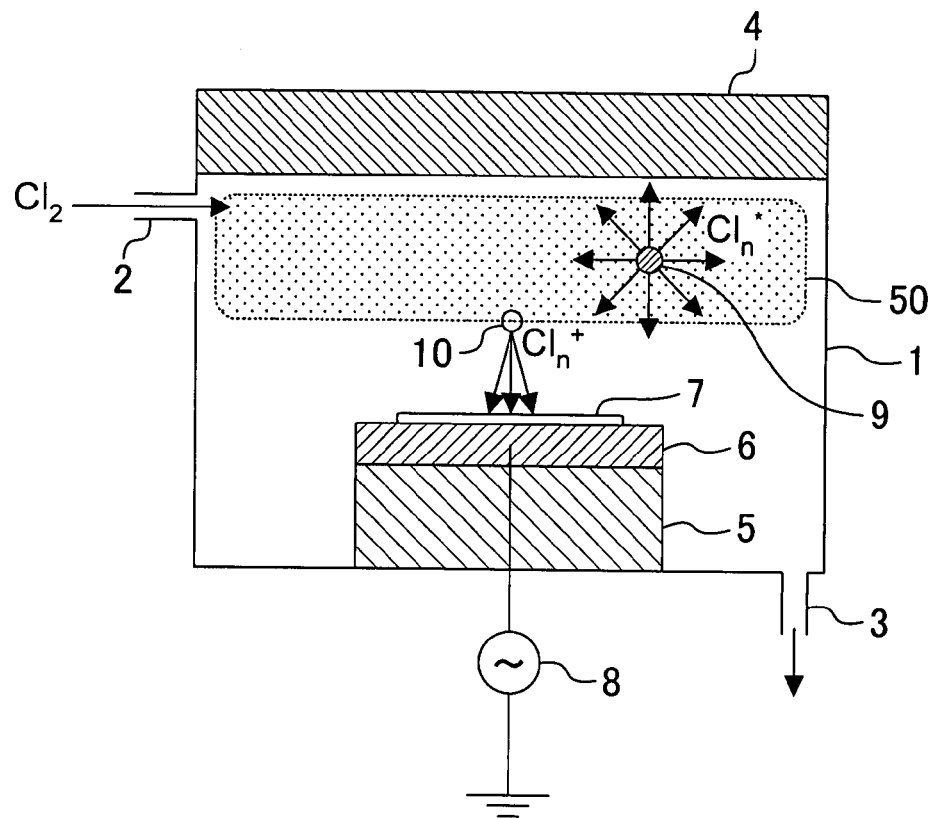
FIGS. 1(a) and 1(b) are explanatory diagrams of a dry etching method according to Embodiment 1 of the invention.

EXPLANATION OF REFERENCES 1 reaction chamber
2 gas inlet
3 gas outlet
4 plasma generator
5 insulator
6 electrode
7 WC substrate
8 RF power source
9 chlorine radical
10 chlorine ion
11 WC substrate
12 resist pattern
13a, 13b, 13c ion
14 sidewall protecting film
15a, 15b, 15c ion
16a, 16b, 16c ion
21 WC alloy substrate
22 resist pattern
23 ion
24a, 24b sidewall protecting film
31 underlying substrate
31a substrate made of a metal or a conducting material
31b substrate made of an insulating material
31c substrate made of a semiconductor material
32 substance including tungsten and carbon
50 plasma
201 processing chamber
202 upper electrode
203 lower electrode
204 ICP RF power source
207 bias RF power source
208 coolant channel
209 vacuum pump
210 etching gas generation system
211A, 211B, 211C first gas tank
212 second gas tank
213 third gas tank
214 molding die
214a base
214b rail-shaped convex portion
217 etching mask
218 plasma radical
219 heat press molding machine
220 pneumatic cylinder
221 heater for heating
222 upper press head
223 heater for heating
224 lower press head
227 guide member
228 holding die
229 molding material
230 molding die 230a base
230b side face
230c rail-shaped convex portion
231 etching mask
231a inclined portion
W workpiece

BEST MODE FOR CARRYING OUT THE INVENTION

Embodiment 1

A dry etching method according to Embodiment 1 of the invention will now be described with reference to the accompanying drawings.

Figure 1B:
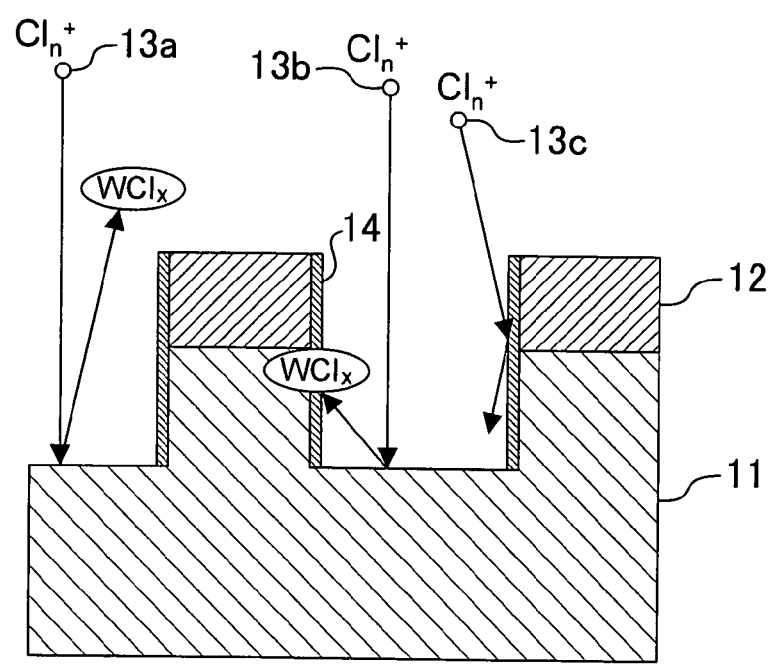

FIGS. 1(a) and 1(b) are explanatory diagrams of the dry etching method of Embodiment 1 of the invention. As shown in FIG. 1(a), a reaction chamber 1 in which a reduced pressure can be kept is provided with a gas inlet 2 and a gas outlet 3. Also, a plasma generator 4 for changing a gas supplied through the gas inlet 2 into plasma is provided in an upper portion of the reaction chamber 1. Furthermore, an electrode 6 on which a target substance, specifically, a WC alloy substrate or a substrate having a WC alloy in its surface portion (hereinafter both referred to as a WC substrate 7), is placed is provided on an insulator 5 in a lower portion of the reaction chamber 1. An RF (radio frequency) power source 8 for applying a bias voltage to the electrode 6 is provided outside the reaction chamber 1.

Next, the operation of the etching system shown in FIG. 1(a), namely, the dry etching method of this embodiment, will be described by exemplifying the case where a chlorine gas is used as an etching gas. As shown in FIG. 1(a), a $Cl_2$ gas is introduced through the gas inlet 2 into the reaction chamber 1, and plasma 50 of the introduced $Cl_2$ gas is generated by the plasma generator 4 and at the same time, RF bias is applied to the WC substrate 7 by the RF power source 8. As a result, chlorine radicals ($Cl_n^*$: n=1 and 2) 9 and chlorine ions 10 ($Cl_n^+$: n=1 and 2) are produced in the plasma 50. It is noted that a mark "*" is herein used for expressing a radical including an excited atom.

The chlorine radicals 9 are isotropically diffused to reach the WC substrate 7, but the chlorine ions 10 are accelerated between the plasma 50 and the WC substrate 7 and hence enter the WC substrate 7 substantially vertically. At this point, the chlorine ions 10 cut bonds between W and C by their kinetic energies to react with W, resulting in releasing $WCl_x$ (wherein x=1 through 6). On the other hand, C is removed in the form of $CCl_x$ (wherein x=1 through 4).

The etching reaction caused on the surface of the WC substrate will be described in more detail with reference to FIG. 1(b). FIG. 1(b) shows a state of the WC substrate being etched by the dry etching method of this embodiment. As shown in FIG. 1(b), after forming a resist pattern 12 on a WC substrate 11, the WC substrate 11 is etched with ions 13a, 13b and 13c composed of $Cl_n^+$ (wherein n=1 and 2) ions by using the resist pattern 12 as a mask, and the W included in the WC substrate 11 is released in the form of $WCl_x$ (wherein x=1 through 6) which will form a sidewall protecting film 14. It is noted that although not shown, chlorine radicals (see the chlorine radicals 9 in FIG. 1(a)) isotropically scatter from plasma. Also, it is conceivable that the chlorine radicals will be adsorbed physically or chemically onto part of the surface being etched (the bottom and side faces of the pattern of the WC substrate 11 and the top and side portions of the resist pattern 12), be reflected from the surface being etched to enter the gas phase again, or be once adsorbed physically onto the surface being etched and then re-released. In this etching, spontaneous chemical reaction by chlorine radicals adsorbed onto the surface being etched is considerably difficult to cause as compared with the case of employing fluorine.

On the other hand, out of the chlorine ions, the ion 13a substantially vertically entering the WC substrate 11 cuts a bond between W and C by its ion impact energy and is chemically bonded to W to produce a reaction product of $WCl_x$. At this point, the $WCl_x$ reacts with a plurality of incident chlorine ions a plurality of times to be ultimately released into the gas phase as a molecule of $WCl_5$, $WCl_6$, or the like. Furthermore, like the chlorine ion 13b, some ions chemically react with W on the surface subjected to etching reaction, and a resultant reaction product $WCl_x$ is released into the gas phase to be adsorbed onto the side face of the pattern of the WC substrate 11 being etched and the side face of the resist pattern 12. In particular, this adsorption is likely to occur where X=1 through 4 in $WCl_x$. Since $WCl_x$ has a lower vapor pressure than $WF_x$, the probability of $WCl_x$ re-release after adsorption is low. Therefore, $WCl_x$ adsorbed onto the side face of the pattern of the WC substrate 11 is kept deposited on the side face to form the sidewall protecting film 14. This phenomenon is also conceivable easily from the fact that $WF_6$ has a boiling point of 17.5° C. (at atmospheric pressure) whereas $WCl_5$ and $WCl_6$ have boiling points of 275.6° C. and 346.7° C., respectively. The presence of this sidewall protecting film 14 prevents the chlorine ion 13c obliquely entering the WC substrate 11 from etching the side face of the pattern, so that the side face is not formed in the bowing shape caused in the conventional technique. It is noted that C in the WC substrate 11 is removed through etching in the form of a reaction product of $CCl_x$ (x=1 through 4), particularly in the form of $CCl_4$.

As described so far, according to the dry etching method of this embodiment, etching for attaining a highly precise vertical shape free from a bowing shape can be performed on the surface and the inside of a WC alloy that is a substance including tungsten and carbon as principal components.

In this embodiment, description has been made of the case where a chlorine molecule is used as the gas including a chlorine atom. Instead of the chlorine molecule, a hydrogen chloride molecule or a boron trichloride molecule may be used. Also, a mixture of two or all gases selected from a chlorine molecule, a hydrogen chloride molecule, and a boron trichloride molecule may be used instead. This enables easy handling of gas supply and the like because these molecules are relatively small in weight, and concurrently enables efficient chlorine production through plasma discharge. As a result, gas supply can be conducted at a low cost. Even though another gas including chlorine other than the aforementioned gases is used, the dry etching method of the invention is, of course, operable. However, in general, a larger molecule has a lower vapor pressure and may become in the form of a solid source. In this case, it is difficult to supply the molecule and the cost of using it increases.

Moreover, in this embodiment, if a gas including an oxygen atom is mixed into a gas including a chlorine atom, the etching rate can be increased. The reason for this is as follows: C remaining after removal of W by a chlorine ion is removed in the form of $CCl_x$ (x=1 through 4), and in addition to this, an oxygen radical and an oxygen ion provide the effect of removing the C in the form of $CO_2$ or CO. This effect is sufficiently provided even when the flow rate of the gas including oxygen is less than 10% of the total flow rate of the gas including chlorine and the gas including oxygen. Practically, it is sufficient that the flow rate of the gas including oxygen is set to a desired flow rate within a range of approximately 50% or less of the total gas flow rate. In addition, if an oxygen molecule, a nitrogen oxide molecule, a sulfur oxide molecule, a carbon oxide molecule, or a mixture of two or more of them is used as the gas including an oxygen atom, oxygen can be supplied efficiently. Instead of mixing of the gas including an oxygen atom, a gas including a chlorine atom and an oxygen atom, such as $COCl_2$, $ClFO_3$, $NOCl$, $NO_2Cl$, $SOCl_2$, $SO_2Cl_2$, or $SO_3HCl$ may be used.

Furthermore, in this embodiment, if an inert gas is mixed into a gas including a chlorine atom, the plasma discharge can be further stabilized due to an inert gas effect, and hence, what is called a process window can be easily increased. Specifically, when an inert gas is mixed at a flow rate several times as large as the flow rate of the chlorine gas, the electron temperature within the plasma is regulated by the electron temperature of the inert gas, resulting in a stabilization of the plasma discharge. As the inert gas, for example, Ar may be used. Alternatively, when any of He, Ne, Ar, Kr, Xe and Rn is selectively used as the inert gas, the electron temperature within the plasma can be increased or reduced. In other words, the electron temperature of the plasma of an inert gas largely depends upon the first ionization energy of the inert gas. Therefore, when plasma with a higher electron temperature is desired to generate, an inert gas with a smaller atomic number can be used, and when plasma with a lower electron temperature is desired to generate, an inert gas with a larger atomic number can be used. At this point, two or more inert gases may be mixedly used.

Moreover, an etching system used in this embodiment may be any of a reactive ion etching (RIE) system of a parallel plate type or the like, a dual frequency parallel plate RIE system, a magnetron enhanced RIE (MERIE) system, an inductively coupled plasma (ICP) etching system, an electron cyclotron resonance (ECR) etching system, a UHF plasma etching system, and a neutral loop discharge (NLD) etching system. Also, the optimal etching conditions are different depending upon the method employed by the etching system, and the ranges of the etching conditions of this embodiment are, for example, a gas flow rate of several tens through several hundreds of cubic centimeters per minute (at room temperature), a pressure of 0.1 through 20 Pa, a high-frequency power for plasma generation of a hundred through several thousands of watts, and an RF bias voltage of a hundred through a thousand of watts.

Furthermore, although the WC substrate including tungsten and carbon as the principal components is etched in this embodiment, a metal, an insulating or a semiconductor substance having the substance including tungsten and carbon on its surface may be etched instead. Moreover, when the substance including tungsten and carbon further includes nitrogen, the same effects as those described in this embodiment can be attained. In other words, the same effects as those described in this embodiment can be attained also in etching a WCN alloy or a WNC alloy.

Embodiment 2

Now, a dry etching method according to Embodiment 2 of the invention will be described with reference to the accompanying drawings. A difference of the dry etching method of this embodiment from that of Embodiment 1 is that a substance including tungsten and carbon as principal compositions is dry etched by using plasma generated from, instead of a gas including chlorine, a mixed gas of a gas including chlorine and a gas including fluorine.

Figure 2:
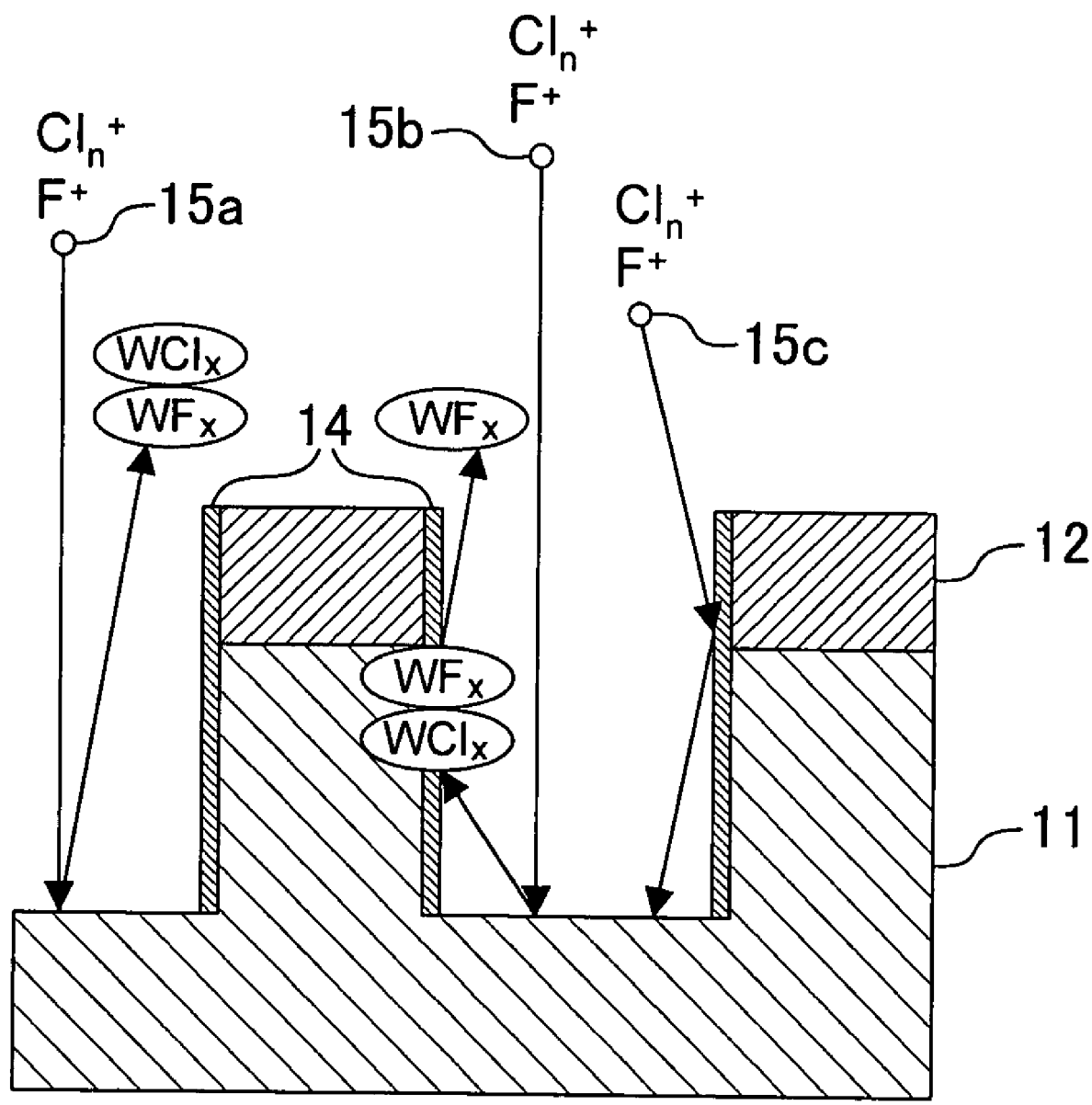
FIG. 2 is an explanatory diagram of a dry etching method according to Embodiment 2 of the invention.

FIG. 2 is an explanatory diagram of the dry etching method according to Embodiment 2 of the invention, which shows a state of a WC substrate being etched by the dry etching method. In this embodiment, the etching system shown in FIG. 1(a) is employed like Embodiment 1. Hereinafter, the dry etching method of this embodiment will be described by exemplifying the case where a chlorine molecule is used as the gas including chlorine and $CF_4$ is used as the gas including fluorine.

Referring to FIG. 2, in this embodiment, a resist pattern 12 is formed on a WC substrate 11, and then by using the resist pattern 12 as a mask, the WC substrate 11 is etched with ions 15a, 15b, and 15c of a $Cl_n^+$ (n=1 and 2) ion produced by a chlorine molecule or a $F^+$ ion produced by $CF_4$.

In this embodiment, W etching by $F^+$ ions is added to W etching by $Cl_n^+$ ions like Embodiment 1. Therefore, W can be etched at a higher rate in this embodiment than in Embodiment 1. To be more specific, out of chlorine ions and fluorine ions, the ion 15a substantially vertically entering the WC substrate 11 cuts a bond between W and C by its ion impact energy, and is chemically bonded to W. Then, resultant reaction products in the form of $WCl_x$ (x=1 through 6) or $WF_x$ (x=1 through 6) are released into the gas phase, thereby removing W. Out of etching reaction products of $WCl_x$ and $WF_x$ produced by the ions 15b of a $Cl_n^+$ ion or a $F^+$ ion, $WCl_x$ is adsorbed again onto an etched side face of the WC substrate 11 or the side face of the resist pattern 12 to form a sidewall protecting film 14. At this time, although some amount of $WF_x$, which is the other reaction product, contributes to formation of the sidewall protecting film 14, the majority thereof is reflected from the surface of the sidewall protecting film 14, and then detached and removed. Thus, the etching reaction caused on the side face of the pattern of the WC substrate 11 by the ion 15c obliquely entering the WC substrate 11 is blocked by the sidewall protecting film 14. As a result of this, as shown in FIG. 2, a vertical etching shape can be realized on and inside the WC substrate 11. In this embodiment, C within the WC substrate 11 is removed not only in the form of $CCl_y$ (y=1 through 4) but also $CF_y$ (y=1 through 4), which leads to an increased etching rate of W and C.

As described so far, according to Embodiment 2, in addition to the same effects as Embodiment 1, mixed use of a gas including fluorine into a gas including chlorine can realize not only a vertical etching shape by the effect of chlorine but also rapid etching by the effect of fluorine.

In this embodiment, description has been made of the case where a chlorine molecule is used for the gas including a chlorine atom. Instead of the chlorine molecule, a hydrogen chloride molecule or a boron trichloride molecule may be used. Also, a mixture of two or all gases selected from a chlorine molecule, a hydrogen chloride molecule, and a boron trichloride molecule may be used instead. This enables easy handling of gas supply and the like because these molecules are relatively small in weight, and concurrently enables efficient chlorine production through plasma discharge. As a result, gas supply can be conducted at a low cost. Even though another gas including chlorine other than the aforementioned gases is used, the dry etching method of the invention is, of course, operable. However, in general, a larger molecule has a lower vapor pressure and may become in the form of a solid source. In this case, it is difficult to supply the molecule and the cost of using it increases.

Moreover, in this embodiment, description has been made of the case where $CF_4$ is used as the gas including a fluorine atom. Instead of this, a carbon fluoride gas such as $C_2F_6$ or a carbon hydrofluoride gas such as $CHF_3$ or $CH_2F_2$ may be used. Or, instead of mixing of the gas including a fluorine atom, a gas including a chlorine atom and a fluorine atom, for example, a chlorine fluoride gas such as $ClF_3$ may be used.

Although $F_2$ may be used as the gas including a fluorine atom, in this case, a $F_2$ gas diluted in advance with He to about 3% by volume is preferably used for safety. Furthermore, since the aforementioned gases including a fluorine atom have low molecular weights, supply of the gases can be made in an easy manner to allow a low-cost etching process.

Furthermore, like this embodiment, in the case where a gas including a chlorine atom and a gas including a fluorine atom are mixedly used, the mixing ratio of the gas including a fluorine atom to the total flow rate of the gas including a chlorine atom and the gas including a fluorine atom is preferably set within the range from approximately 20% to approximately 80% by volume, and more preferably, from approximately 30% to approximately 70% by volume. This provides a high etching rate effect, which is an advantageous point of the gas including a fluorine atom, without losing the effect of forming a sidewall protecting film by $WCl_x$, which is an advantageous point of the gas including a chlorine atom. That is to say, the effects of both of the gas including a chlorine atom and the gas including a fluorine atom can be exerted. If the effect exerted by either one of these gases is particularly desired to emphasize, it is sufficient that the mixing ratio of the gas having the effect desired to emphasize is raised within the range of the mixing ratio described above.

Moreover, in this embodiment, if a gas including an oxygen atom is mixed into a gas including a chlorine atom and a gas including a fluorine atom, the etching rate can be further increased. The reason for this is as follows: C remaining after removal of W by a chlorine ion is removed in the form of $CCl_y$ (y=1 through 4), and in addition to this, an oxygen radical and an oxygen ion provide the effect of removing the C in the form of $CO_2$ or CO. This effect is sufficiently provided even when the flow rate of the gas including oxygen is less than 10% of the total flow rate of the gases including chlorine, fluorine, and oxygen, respectively. Practically, it is sufficient that the flow rate of the gas including oxygen is set to a desired flow rate within a range of approximately 50% or less of the total gas flow rate. In addition, if an oxygen molecule, a nitrogen oxide molecule, a sulfur oxide molecule, a carbon oxide molecule, or a mixture of two or more of them is used as the gas including an oxygen atom, oxygen can be efficiently supplied. Instead of mixing of the gas including an oxygen atom, for example, a gas including a chlorine atom and an oxygen atom, such as $COCl_2$, $ClFO_3$, $NOCl_1$, $NO_2Cl$, $SOCl_2$, $SO_2Cl_2$, or $SO_3HCl$ may be used.

Furthermore, in this embodiment, if an inert gas is mixed into a gas including a chlorine atom and a gas including a fluorine atom, the plasma discharge can be further stabilized due to an inert gas effect, and hence, what is called a process window can be easily increased. Specifically, when an inert gas is mixed at a flow rate several times as large as the flow rate of the chlorine gas, the electron temperature within the plasma is regulated by the electron temperature of the inert gas, resulting in a stabilization of the plasma discharge. As the inert gas, for example, Ar may be used. Alternatively, when any of He, Ne, Ar, Kr, Xe and Rn is selectively used as the inert gas, the electron temperature within the plasma can be increased or reduced. In other words, the electron temperature of the plasma of an inert gas largely depends upon the first ionization energy of the inert gas. Therefore, when plasma with a higher electron temperature is desired to generate, an inert gas with a smaller atomic number can be used, and when plasma with a lower electron temperature is desired to generate, an inert gas with a larger atomic number can be used. At this point, two or more inert gases may be mixedly used.

Moreover, an etching system used in this embodiment may be any of a reactive ion etching (RIE) system of a parallel plate type or the like, a dual frequency parallel plate RIE system, a magnetron enhanced RIE (MERIE) system, an inductively coupled plasma (ICP) etching system, an electron cyclotron resonance (ECR) etching system, a UHF plasma etching system, and a neutral loop discharge (NLD) etching system.

Furthermore, although the WC substrate including tungsten and carbon as the principal components is etched in this embodiment, a metal, an insulating or a semiconductor substance having the substance including tungsten and carbon on its surface may be etched instead. Moreover, when the substance including tungsten and carbon further includes nitrogen, the same effects as those described in this embodiment can be attained. In other words, the same effects as those described in this embodiment can be attained also in etching a WCN alloy or a WNC alloy.

Embodiment 3

Now, a dry etching method according to Embodiment 3 of the invention will be described with reference to the accompanying drawings. A difference of the dry etching method of this embodiment from that of Embodiment 1 is that a substance including tungsten and carbon as principal components is dry etched by using plasma generated from, instead of a gas including chlorine, a gas including chlorine and at least one of a gas including bromine and a gas including iodine.

Figure 3A:
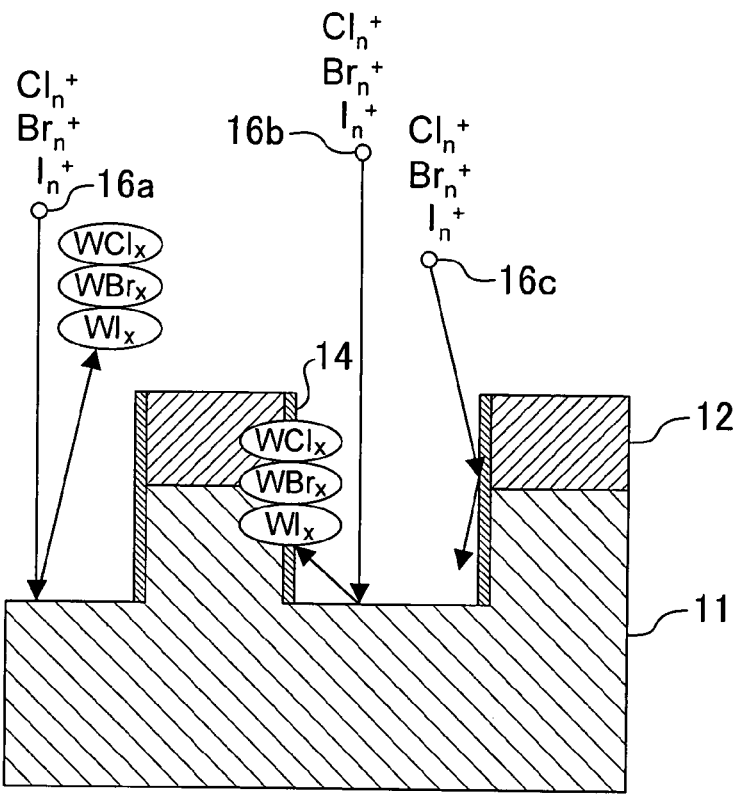
FIGS. 3(a) and 3(b) are explanatory diagrams of a dry etching method according to Embodiment 3 of the invention.
Figure 3B:
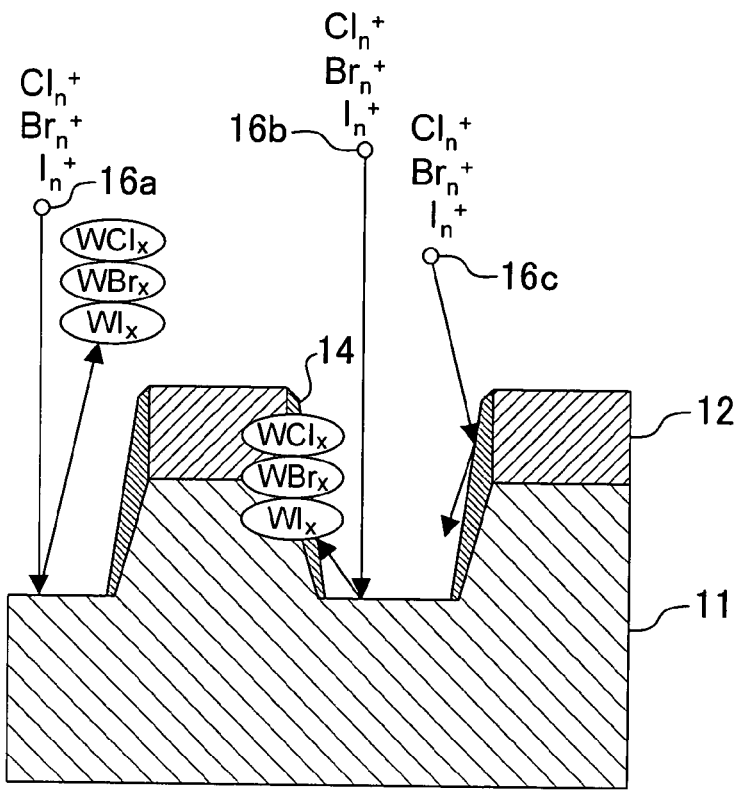

FIGS. 3(a) and 3(b) are explanatory diagrams of the dry etching method of Embodiment 3 of the invention, in each of which a state of a WC substrate being etched by the dry etching method is shown. It is noted that FIG. 3(a) shows a case where a sidewall protecting film is formed in a small thickness and FIG. 3(b) shows a case where a sidewall protecting film is formed in a large thickness. Also, in this embodiment, the etching system shown in FIG. 1(a) is employed like Embodiment 1. Now, the dry etching method of this embodiment will be described by exemplifying a case where $Cl_2$, $Br_2$ and $I_2$ are used as the gas including chlorine, the gas including bromine and the gas including iodine, respectively.

As shown in FIGS. 3(a) and 3(b), in this embodiment, a resist pattern 12 is formed on a WC substrate 11. Then, by using the resist pattern 12 as a mask, the WC substrate 11 is etched with ions 16a, 16b, and 16c of a $Cl_n^+$ (n=1 and 2) ion produced by $Cl_2$, a $Br_n^+$ (n=1 and 2) ion produced by $Br_2$, an $I_n^+$ (n=1 and 2) ion produced by $I_2$. To be more specific, out of chlorine ions, bromine ions, and iodine ions, the ion 16a substantially vertically entering the WC substrate 11 cuts a bond between W and C by its ion impact energy, and is chemically bonded to W. Then, resultant reaction products in the form of $WCl_x$ (x=1 through 6), $WBr_x$ (x=1 through 6), or $WI_x$ (x=1 through 6) are released into the gas phase, thereby removing W. Furthermore, some of etching reaction products produced by the ion 16b of a $Cl_n^+$ ion, a $Br_n^+$ ion or an $I_n^+$ ion are adsorbed again onto an etched side face of the WC substrate 11 or the side face of the resist pattern 12 to form a sidewall protecting film 14. The adsorption probabilities attained at this point are in the order of $WI_x > WBr_x > WCl_x$. As a result, the sidewall protecting film 14 prevents an etching reaction caused on the side face of the pattern of the WC substrate 11 by an ion obliquely entering the WC substrate 11. Accordingly, in the case where the sidewall protecting film 14 is comparatively thin, a vertical etching shape can be realized on and inside the WC substrate 11 as shown in FIG. 3(a), and in the case where the sidewall protecting film 14 is comparatively thick, a downward tapered etching shape can be realized on and inside the WC substrate 11 as shown in FIG. 3(b).

In this embodiment, preferably, the mixing ratio of the gas including a bromine atom or the gas including an iodine atom to the total flow rate of the gas including a chlorine atom and the gas including a bromine atom or the gas including an iodine atom is set within the range of approximately 30% by volume or lower. Even when this mixing ratio is lower than approximately 5%, the effect of forming the sidewall protecting film by the gas including a bromine atom or the gas including an iodine atom can be sufficiently attained. Furthermore, the mixing ratio of the gas including a chlorine atom and the gas including a bromine atom, the mixing ratio of the gas including a chlorine atom and the gas including an iodine atom, or the mixing ratio of the gas including a chlorine atom, the gas including a bromine atom, and the gas including an iodine atom can be modified to change the thickness of the sidewall protecting film. For example, if these mixing ratios are less than 5%, the sidewall protecting film 14 with a relatively small thickness can be formed as shown in FIG. 3(a). In contrast to this, by increasing these mixing ratios, the sidewall protecting film 14 can be thickened. To be more specific, when these mixing ratios are 8% or higher, the thickness of the sidewall protecting film 14 gradually increases. Then, when they exceed approximately 10%, the sidewall protecting film 14 becomes thick to the extent to which etching for forming the etched cross-section in a downward tapered shape as shown in FIG. 3(b) can be attained.

As described so far, according to Embodiment 3, the same effects as Embodiment 1 can be exerted. In addition to this, the following effects can be exerted. Specifically, by mixedly using the gas including a chlorine atom and at least one of the gas including a bromine atom and the gas including an iodine atom, the effect of bromine or iodine can enhance the effect of protecting the side face of the portion to be etched. With this, not only an etching for forming a vertical etching shape but also an etching for forming a downward tapered etching shape can be performed.

In this embodiment, description has been made of the case where a chlorine molecule is used for the gas including a chlorine atom. Instead of the chlorine molecule, a hydrogen chloride molecule or a boron trichloride molecule may be used. Also, a mixture of two or all gases selected from a chlorine molecule, a hydrogen chloride molecule, and a boron trichloride molecule may be used instead. This enables easy handling of gas supply and the like because these molecules are relatively small in weight, and concurrently enables efficient chlorine production through plasma discharge. As a result, gas supply can be conducted at a low cost. Even though another gas including chlorine other than the aforementioned gases is used, the dry etching method of the invention is, of course, operable. However, in general, a larger molecule has a lower vapor pressure and may become in the form of a solid source. In this case, it is difficult to supply the molecule and the cost of using it increases.

Furthermore, in this embodiment, description has been made of the case where $Br_2$ is exemplarily used as the gas including a bromine atom. Instead of this, for example, HBr may be used. Also, description has been made of the case where $I_2$ is exemplarily used as the gas including an iodine atom. Instead of this, for example, HI may be used. Or, a gas including a chlorine atom and at least one of a bromine atom and an iodine atom, such as ICl, $ClF_2Br$, $ClF_2I$ or BrCl, may be used. Alternatively, a molecular gas including carbon, fluorine and halogen, such as $CF_xCl_{4-x}$, $CF_xBr_{4-x}$ or $CF_xI_{4-x}$ (wherein x=1 through 3), may be used. In this case, the effect of increasing the etching rate obtained by F can be simultaneously exerted as in Embodiment 2.

Moreover, in this embodiment, if a gas including an oxygen atom is mixed into a gas including a chlorine atom and a gas including a bromine atom or an iodine atom, the etching rate can be further increased. The reason for this is as follows: C remaining after removal of W by an chlorine ion is removed in the form of $CCl_y$ (y=1 through 4), and in addition to this, an oxygen radical and an oxygen ion provide the effect of removing the C in the form of $CO_2$ or CO. This effect is sufficiently provided even when the flow rate of the gas including oxygen is less than 10% of the total flow rate of the gases including chlorine, bromine (or iodine), and oxygen, respectively. Practically, it is sufficient that the flow rate of the gas including oxygen is set to a desired flow rate within a range of approximately 50% or less of the total gas flow rate. In addition, if an oxygen molecule, a nitrogen oxide molecule, a sulfur oxide molecule, a carbon oxide molecule, or a mixture of two or more of them is used as the gas including an oxygen atom, oxygen can be efficiently supplied. Instead of mixing of the gas including an oxygen atom, for example, a gas including a chlorine atom and an oxygen atom, such as $COCl_2$, $ClFO_3$, $NOC_1$, $NO_2Cl$, $SOCl_2$, $SO_2Cl_2$, or $SO_3HCl$ may be used. In particular, for this embodiment having an increased capability of adsorbing the reaction product again, addition of the gas including an oxygen atom described above greatly aids in enhancing process windows.

Furthermore, in this embodiment, if an inert gas is mixed into a gas including a chlorine atom and a gas including a bromine atom or an iodine atom, the plasma discharge can be further stabilized due to an inert gas effect, and hence, what is called a process window can be easily increased. Specifically, when an inert gas is mixed at a flow rate several times as large as the flow rate of the chlorine gas, the electron temperature within the plasma is regulated by the electron temperature of the inert gas, resulting in a stabilization of the plasma discharge. As the inert gas, for example, Ar may be used. Alternatively, when any of He, Ne, Ar, Kr, Xe and Rn is selectively used as the inert gas, the electron temperature within the plasma can be increased or reduced. In other words, the electron temperature of the plasma of an inert gas largely depends upon the first ionization energy of the inert gas. Therefore, when plasma with a higher electron temperature is desired to generate, an inert gas with a smaller atomic number can be used, and when plasma with a lower electron temperature is desired to generate, an inert gas with a larger atomic number can be used. At this point, two or more inert gases may be mixedly used.

Moreover, an etching system used in this embodiment may be any of a reactive ion etching (RIE) system of a parallel plate type or the like, a dual frequency parallel plate RIE system, a magnetron enhanced RIE (MERIE) system, an inductively coupled plasma (ICP) etching system, an electron cyclotron resonance (ECR) etching system, a UHF plasma etching system, and a neutral loop discharge (NLD) etching system.

Furthermore, although the WC substrate including tungsten and carbon as the principal components is etched in this embodiment, a metal, an insulating or a semiconductor substance having the substance including tungsten and carbon on its surface may be etched instead. Moreover, when the substance including tungsten and carbon further includes nitrogen, the same effects as those described in this embodiment can be attained. In other words, the same effects as those described in this embodiment can be attained also in etching a WCN alloy or a WNC alloy.

Embodiment 4

Now, a fine structure formation method and a mold fabrication method by employing the same according to Embodiment 4 of the invention will be described with reference to the accompanying drawings. It is noted that the dry etching methods described in Embodiments 1 through 3 are applied in this embodiment.

FIGS. 4(a) through 4(f) are cross-sectional views for showing procedures in the mold fabrication method of Embodiment 4 of the invention.

Figure 4A:
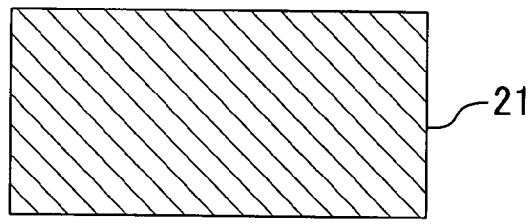
FIGS. 4(a), 4(b), 4(c), 4(d), 4(e) and 4(f) are cross-sectional views for showing procedures in a fine structure formation method according to Embodiment 4 of the invention and a mold fabrication method by employing the same.
Figure 4B:
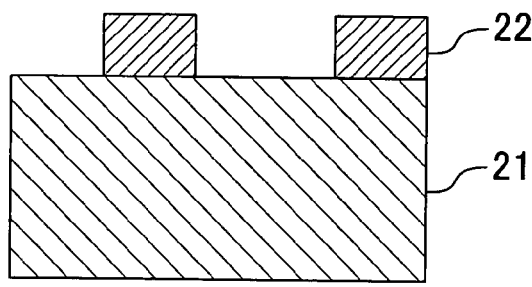

First, a WC alloy substrate 21 is prepared as shown in FIG. 4(a), and then, a resist pattern 22 is formed on the WC alloy substrate 21 as shown in FIG. 4(b). At this point, the resist pattern 22 is generally formed through the lithography technique.

Next, under etching conditions for forming a sidewall protecting film in a small thickness (see Embodiment 3 (and FIG. 3(a) in particular)), the WC alloy substrate 21 is dry etched, with the resist pattern 22 used as a mask, by using plasma generated from a gas including at least a chlorine atom, thereby transferring the pattern onto the WC alloy substrate 21. In general, no matter which type of dry etching system is used for the dry etching, ions 23 entering the WC alloy substrate 21 from the plasma have energy spread. Therefore, there are not only a component A vertically entering the substrate surface but also components entering the substrate surface at an angle, namely, obliquely entering components B and C. However, when the dry etching is performed by using the plasma generated from the gas including at least a chlorine atom, etching reaction products such as $WCl_x$ (wherein x=1 through 6) form a sidewall protecting film 24a on the side face of the etched portion, and therefore, the side face can be prevented from being etched by the obliquely entering components B and C of the ions 23. Accordingly, as shown in FIG. 4(c), a fine structure having, as the etched cross-section, a cross-section vertical to the substrate surface is formed.

Next, the resist pattern 22 and the sidewall protecting film 24a are removed by ashing and cleaning. In this manner, a WC alloy mold made of the WC alloy substrate 21 having a fine concavo-convex pattern with vertical side faces is fabricated as shown in FIG. 4(d).

Figure 4C:
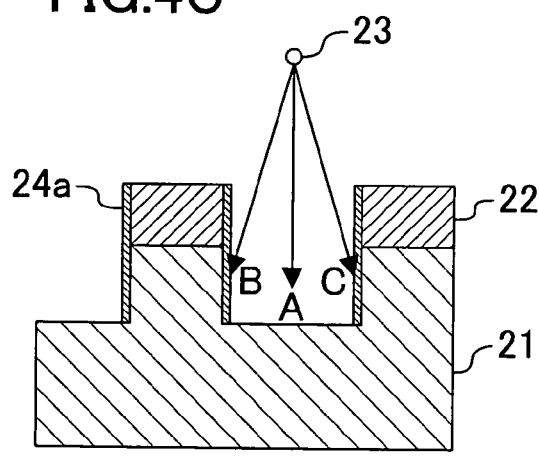
Figure 4E:
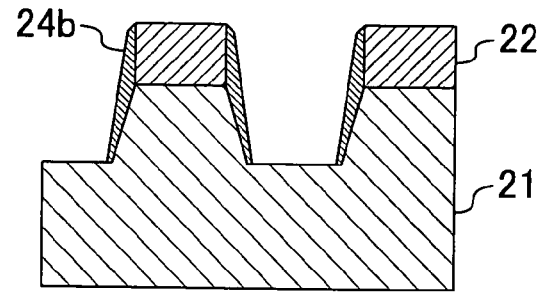
Figure 4D:
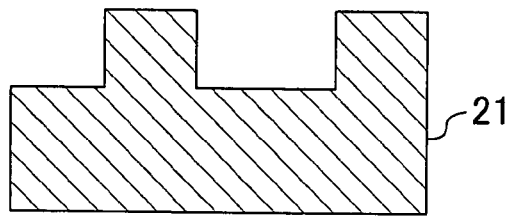

On the other hand, instead of the procedures shown in FIGS. 4(c) and 4(d), the pattern may be transferred onto the WC alloy substrate 21 by dry etching the WC alloy substrate 21, with the resist pattern 22 used as a mask, by using plasma generated from a gas including at least a chlorine atom under etching conditions for forming a sidewall protecting film in a large thickness (see Embodiment 3 (and FIG. 3(b) in particular)) as shown in FIG. 4(e). In this case, a fine structure having a downward tapered shape as the etched cross-section is formed in the WC alloy substrate 21. The reason for this is as follows: since a sidewall protecting film 24b is deposited in a thickness larger than a necessary thickness for preventing the side face from being etched by the ions, an opening area of the etched portion becomes narrower as the etching proceeds.

Figure 4F:
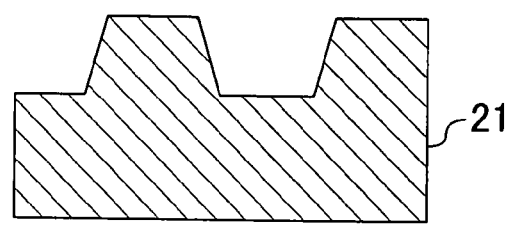

Next, the resist pattern 22 and the sidewall protecting film 24b are removed by the ashing and the cleaning. In this manner, a WC alloy mold made of the WC alloy substrate 21 having a fine concavo-convex structure with downward tapered side faces is fabricated as shown in FIG. 4(f).

As described so far, the fine structure formation method and the mold fabrication method of this embodiment include the steps of: forming a resist pattern on a substance including tungsten and carbon; and etching the substance, with the resist pattern used as a mask, by using plasma generated from a gas including at least a chlorine atom. In other words, since the dry etching method of this invention is employed (according to any of Embodiments 1 through 3) in this embodiment, the surface and the inside of the substance including tungsten and carbon can be etched in a highly precise vertical shape or a highly precise downward tapered shape free from a bowing shape. Accordingly, a mold having a fine concavo-convex pattern with a vertical cross-section or a downward tapered cross-section can be definitely fabricated.

Although the resist pattern is used as the etching mask in this embodiment, it goes without saying that a hard mask made of an insulating film or the like may be used instead.

In this embodiment, as the gas including a chlorine atom, a chlorine molecule, a hydrogen chloride molecule, a boron trichloride molecule or a mixture of two or more gases of them may be used. This enables easy handling of gas supply and the like because these molecules are relatively small in weight, and concurrently enables efficient chlorine production through plasma discharge. Therefore, the substance including tungsten and carbon can be etched into a vertical shape at more inexpensive cost and with high precision. As a result of this, a mold having a fine concavo-convex pattern with a side face in a highly precise vertical shape can be fabricated more inexpensively.

Moreover, in this embodiment, a gas including an oxygen atom is preferably mixed into a gas including a chlorine atom. With this, the effect of adding oxygen increases the etching rate, so that the substance including tungsten and carbon can be rapidly etched into a highly precise vertical shape. As a result, a mold having a fine concavo-convex pattern with a side face in a highly precise vertical shape can be provided rapidly. In this condition, an oxygen molecule, a nitrogen oxide molecule, a sulfur oxide molecule, a carbon oxide molecule, or a mixture of two or more of them is preferably used as the gas including an oxygen atom. This enables an efficient supply of oxygen, so that the substance including tungsten and carbon can be etched stably and rapidly into a highly precise vertical shape. As a result, a mold having a fine concavo-convex pattern with a side face in a highly precise vertical shape can be fabricated stably and rapidly. Instead of mixing of the gas including an oxygen atom, a gas including a chlorine atom and an oxygen atom, such as $COCl_2$, $ClFO_3$, $NOCl$, $NO_2Cl$, $SOCl_2$, $SO_2Cl_2$, or $SO_3HCl$ may be used.

Furthermore, in this embodiment, an inert gas is preferably mixed into a gas including a chlorine atom. With this, the plasma discharge can be further stabilized due to an inert gas effect, so that the substance including tungsten and carbon can be etched more stably into a highly precise vertical shape. As a result, a mold having a fine concavo-convex pattern with a side face in a highly precise vertical shape can be fabricated more stably.

In this embodiment, a gas including a fluorine atom is preferably mixed into the gas including a chlorine atom. With this, the effect of fluorine increases the etching rate without losing the capability of forming a vertical shape by chlorine, so that the substance including tungsten and carbon can be etched more rapidly into a highly precise vertical shape. As a result, a mold having a fine concavo-convex pattern with a side face in a highly precise vertical shape can be fabricated more rapidly. In this condition, as the gas including a fluorine atom, a carbon fluoride gas such as $CF_4$ or $C_2F_6$ or a carbon hydrofluoride gas such as $CHF_3$ or $CH_2F_2$ may be used. Or, instead of mixing of the gas including a fluorine atom, a gas including a chlorine atom and a fluorine atom, for example, a chlorine fluoride gas such as $ClF_3$ may be used. Although $F_2$ may be used as the gas including a fluorine atom, in this case, a $F_2$ gas diluted in advance with He to about 3% by volume is preferably used for safety. Since the aforementioned gases including a fluorine atom have low molecular weights, supply of the gases can be made in an easy manner to allow a low-cost etching processing.

Furthermore, in this embodiment, in the case where a gas including a chlorine atom and a gas including a fluorine atom are mixedly used, the mixing ratio of the gas including a fluorine atom to the total flow rate of the gas including a chlorine atom and the gas including a fluorine atom is preferably set within the range from approximately 20% to approximately 80% by volume, and more preferably, from approximately 30% to approximately 70% by volume. This provides a high etching rate effect, which is an advantageous point of the gas including a fluorine atom, without losing the effect of forming a sidewall protecting film by $WCl_x$, which is an advantageous point of the gas including a chlorine atom. As a result, an etching providing an etched cross-section in a vertical shape can be performed rapidly. In other wards, the effects of both of the gas including a chlorine atom and the gas including a fluorine atom can be exerted. If the effect exerted by either one of these gases is particularly desired to emphasize, it is sufficient that the mixing ratio of the gas having the effect desired to emphasize is raised within the range of the mixing ratio described above.

Moreover, in this embodiment, at least one of a gas including a bromine atom and a gas including an iodine atom is preferably mixed into the gas including a chlorine atom. With this, the effect of bromine or iodine can enhance the effect of protecting the side face of the portion to be etched, so that etching can be performed to form not only a highly precise vertical etching shape but also a highly precise downward tapered etching shape. As a result, not only a mold having a fine concavo-convex pattern with a side face in a highly precise vertical shape but also a mold having a fine concavo-convex pattern with a side face in a highly precise downward tapered shape can be fabricated. In this condition, $Br_2$, HBr, or the like may be used as the gas including a bromine atom, and $I_2$, HI, or the like may be used as the gas including an iodine atom. Or, a gas including a chlorine atom and at least one of a bromine atom and an iodine atom, such as ICl, $ClF_2Br$, $ClF_2I$ or BrCl, may be used. Alternatively, a molecular gas including carbon, fluorine and halogen, such as $CF_xCl_{4-x}$, $CF_xBr_{4-x}$ or $CF_xI_{4-x}$ (wherein x=1 through 3), may be used. In this case, the effect of increasing the etching rate obtained by F can be simultaneously exerted as in Embodiment 2.

In this embodiment, in the case where at least one of a gas including a bromine atom and a gas including an iodine atom is mixed into the gas including a chlorine atom, preferably, the mixing ratio of the gas including a bromine atom or the gas including an iodine atom to the total flow rate of the gas including a chlorine atom and the gas including a bromine atom or the gas including an iodine atom is set within the range of approximately 30% by volume or lower. Even when this mixing ratio is lower than 5%, the effect of forming the sidewall protecting film by the gas including a bromine atom or the gas including an iodine atom can be sufficiently attained. Furthermore, the mixing ratio of the gas including a chlorine atom and the gas including a bromine atom, the mixing ratio of the gas including a chlorine atom and the gas including an iodine atom, or the mixing ratio of the gas including a chlorine atom, the gas including a bromine atom, and the gas including an iodine atom can be modified to change the thickness of the sidewall protecting film. For example, if these mixing ratios are less than 5%, the sidewall protecting film 24a with a relatively small thickness can be formed as shown in FIG. 4(c). Therefore, etching processing for forming an etched cross-section in a vertical shape can be performed. In contrast to this, by increasing these mixing ratios, the sidewall protecting film can be thickened. To be more specific, when these mixing ratios are 8% or higher, the thickness of the sidewall protecting film gradually increases. Then, when they exceed approximately 10%, the sidewall protecting film 24b becomes thick to the extent to which etching for forming the etched cross-section in a downward tapered shape as shown in FIG. 4(e) can be attained.

Moreover, an etching system used in this embodiment may be any of a reactive ion etching (RIE) system of a parallel plate type or the like, a dual frequency parallel plate RIE system, a magnetron enhanced RIE (MERIE) system, an inductively coupled plasma (ICP) etching system, an electron cyclotron resonance (ECR) etching system, a UHF plasma etching system, and a neutral loop discharge (NLD) etching system.

Furthermore, although the WC substrate including tungsten and carbon as the principal components is etched in this embodiment, a metal, an insulating or a semiconductor substance having the substance including tungsten and carbon on its surface may be etched instead. Moreover, when the substance including tungsten and carbon further includes nitrogen, the same effects as those described in this embodiment can be attained. In other words, the same effects as those described in this embodiment can be attained also in etching a WCN alloy or a WNC alloy.

Embodiment 5

Now, a mold according to Embodiment 5 of the invention will be described with reference to the accompanying drawings. It is noted that the mold of this embodiment is obtained by the mold fabrication method described in Embodiment 4.

Figure 5A:
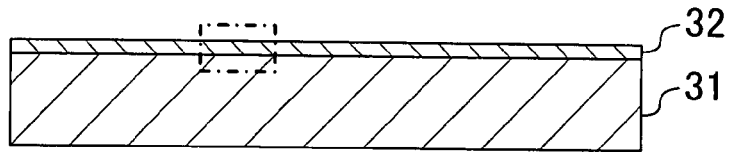
FIG. 5(a) is a cross-sectional view of a whole mold according to Embodiment 5 of the invention and FIGS. 5(b), 5(c), 5(d), 5(e), 5(f) and 5(g) are enlarged views for showing a fine concavo-convex pattern on the surface of the mold illustrated in FIG. 5(a).

FIG. 5(a) is a cross-sectional view of the whole mold of this embodiment. As shown in FIG. 5(a), a substance 32 including tungsten and carbon such as a WC alloy is formed on an underlying substrate 31. On the surface of the substance 32, a fine concavo-convex pattern with a vertical shape (a shape having a side face vertical to the substrate surface) or a downward tapered shape is formed by the dry etching method of any of Embodiments 1 through 3. Also, FIGS. 5(b) through 5(d) and 5(e) through 5(g) are enlarged views of the fine concavo-convex pattern formed on a surface portion (surrounded with an alternate long and short dash line) of the mold of FIG. 5(a).

Figure 5B:
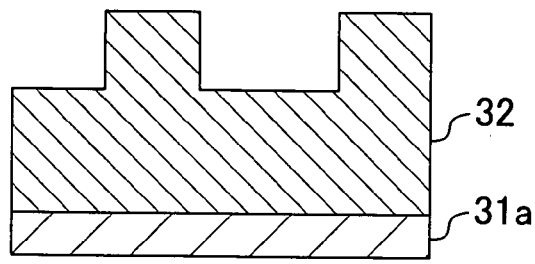
Figure 5E:
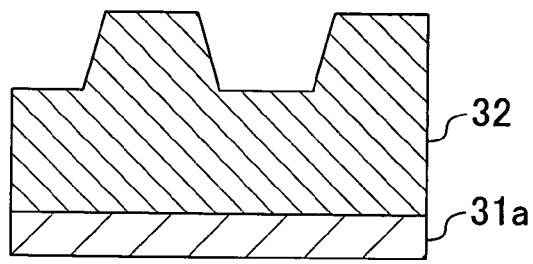
Figure 5C:
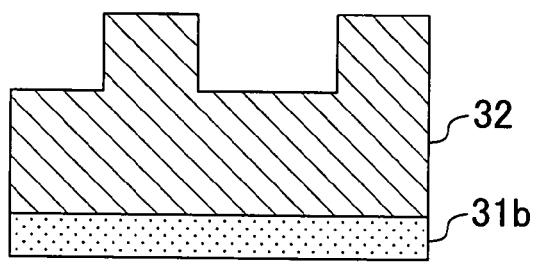
Figure 5F:
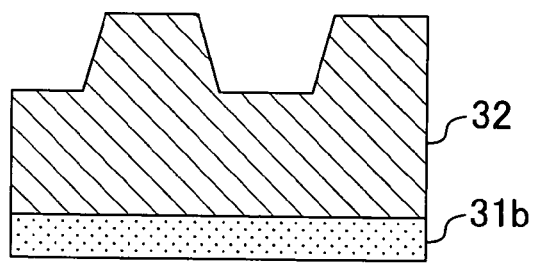
Figure 5D:
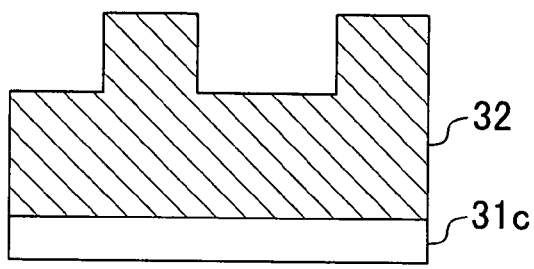
Figure 5G:
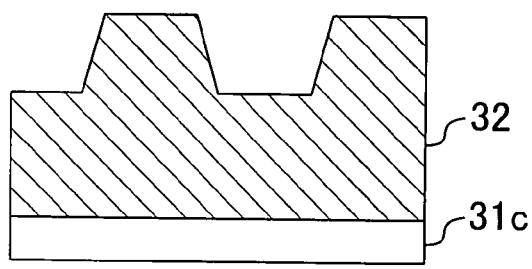
Figure 6A:
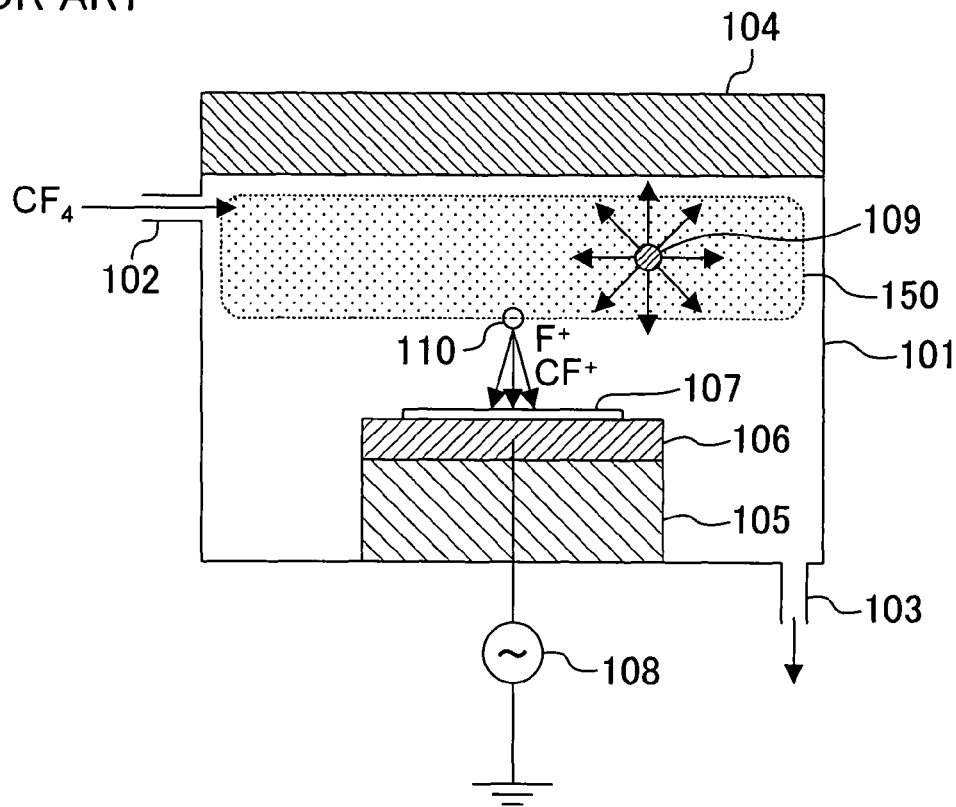
FIGS. 6(a) and 6(b) are explanatory diagrams of a conventional dry etching method.
Figure 6B:
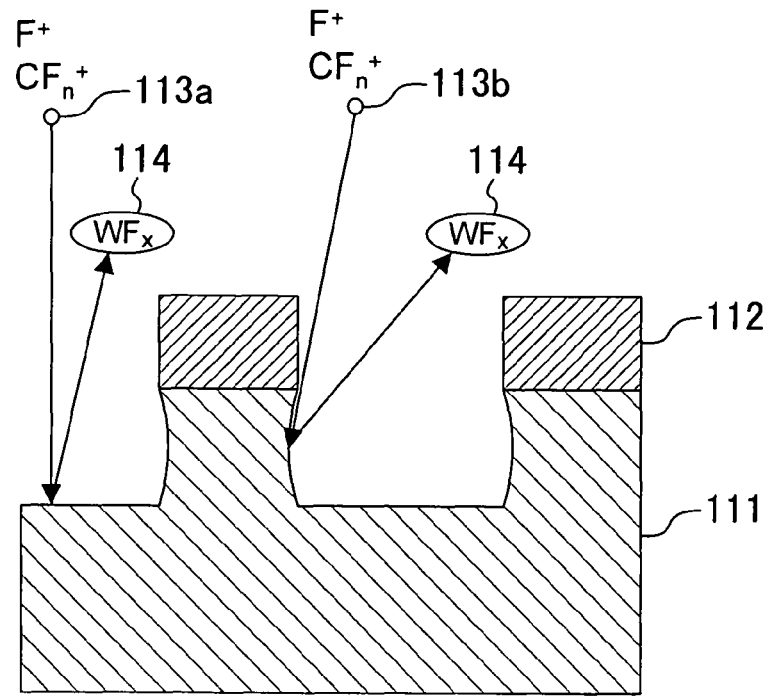
Figure 7A:
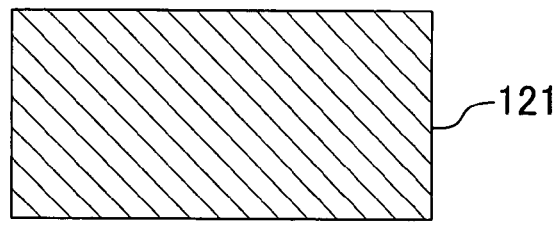
FIGS. 7(a), 7(b), 7(c) and 7(d) are cross-sectional views for showing procedures in a conventional fine structure formation method and a conventional mold fabrication method by employing the same.
Figure 7B:
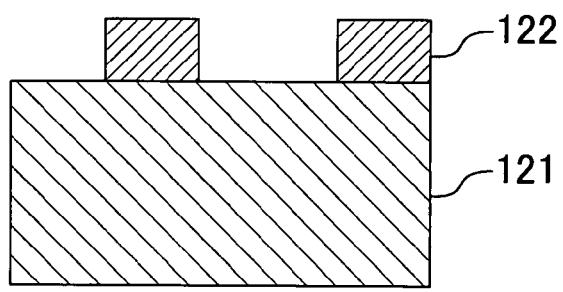
Figure 7C:
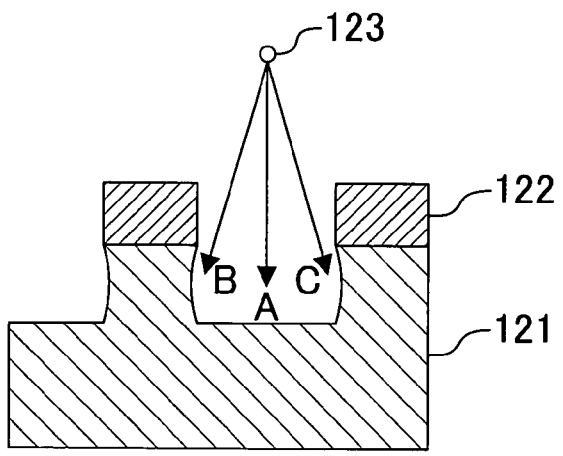
Figure 7D:
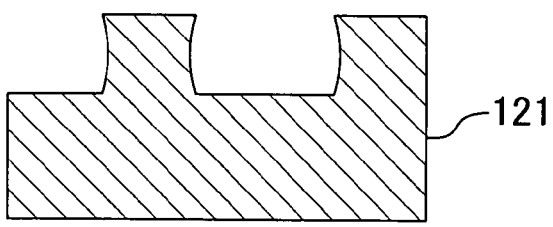

Since the mold of this embodiment is fabricated by dry etching the substance including tungsten and carbon by using plasma generated from a gas including at least a chlorine atom, formation can be made of a mold having a fine concavo-convex pattern in a vertical cross-section free from a bowing shape as shown in FIGS. 5(b) through 5(d), or a mold having a fine concavo-convex pattern in a downward tapered cross-section as shown in FIGS. 5(e) through 5(g).

The underlying substrate 31 of the mold may be a substrate 31a made of a metal or a conducting material (shown in FIG. 5(b) or 5(e)), a substrate 31b made of an insulating material (shown in FIG. 5(c) or 5(f)) or a substrate 31c made of a semiconductor material (shown in FIG. 5(d) or 5(g)), and the material for the substrate can be selected in accordance with the use of the mold. For example, in the case where the mold is used with a current allowed to flow therethrough, the substrate 31a can be selected as the underlying substrate 31. Alternatively, in the case where the mold is used with electrically insulated, the substrate 31b can be selected as the underlying substrate 31.

In this embodiment, as the gas including a chlorine atom for use in the mold fabrication, a chlorine molecule, a hydrogen chloride molecule, a boron trichloride molecule, or a mixture of two or more gases of them may be used. This enables easy handling of gas supply and the like because these molecules are relatively small in weight, and concurrently enables efficient chlorine production through plasma discharge. Therefore, a mold having a fine concavo-convex pattern with a side face in a highly precise vertical shape can be provided more inexpensively.

Moreover, in this embodiment, a gas including an oxygen atom is preferably mixed into a gas including a chlorine atom for use in the mold fabrication. With this, the effect of adding oxygen increases the etching rate, so that a mold having a fine concavo-convex pattern with a side face in a highly precise vertical shape can be fabricated and provided rapidly. In this condition, an oxygen molecule, a nitrogen oxide molecule, a sulfur oxide molecule, a carbon oxide molecule, or a mixture of two or more of them is preferably used as the gas including an oxygen atom. This enables an efficient supply of oxygen, so that a mold having a fine concavo-convex pattern with a side face in a highly precise vertical shape can be fabricated and provided stably and rapidly. Instead of mixing of the gas including an oxygen atom, a gas including a chlorine atom and an oxygen atom, such as $COCl_2$, $ClFO_3$, $NOC_1$, $NO_2Cl$, $SOCl_2$, $SO_2Cl_2$, or $SO_3HCl$ may be used.

Furthermore, in this embodiment, an inert gas is preferably mixed into a gas including a chlorine atom for use in the mold fabrication. With this, the plasma discharge can be further stabilized due to an inert gas effect, so that a mold having a fine concavo-convex pattern with a side face in a highly precise vertical shape can be fabricated and provided more stably.

In this embodiment, a gas including a fluorine atom is preferably mixed into the gas including a chlorine atom for use in the mold fabrication. With this, the effect of fluorine increases the etching rate without losing the capability of forming a vertical shape by chlorine, so that a mold having a fine concavo-convex pattern with a side face in a highly precise vertical shape can be fabricated and provided more rapidly. Instead of mixing of the gas including a fluorine atom, a gas including a chlorine atom and a fluorine atom, for example, a chlorine fluoride gas such as $ClF_3$ may be used.

Moreover, in this embodiment, at least one of a gas including a bromine atom and a gas including an iodine atom is preferably mixed into the gas including a chlorine atom for use in the mold fabrication. With this, the effect of bromine or iodine can enhance the effect of protecting the side face of the portion to be etched, so that not only a mold having a fine concavo-convex pattern with a side face in a highly precise vertical shape but also a mold having a fine concavo-convex pattern with a side face in a highly precise downward tapered shape can be provided. Instead of mixing of at least one of the gas including a bromine atom and the gas including an iodine atom, a gas including a chlorine atom and at least one of a bromine atom and an iodine atom, such as ICl, $ClF_2Br$, $ClF_2I$ or BrCl, may be used.

In this manner, according to this embodiment, a mold having a fine concavo-convex pattern etched with high precision can be provided inexpensively, easily and stably. Also, a fine concavo-convex pattern having a side face in any shape, as the cross-sectional shape of the fine concavo-convex pattern, ranging from a shape vertical to the substrate surface to a downward tapered shape (namely, a shape in which the upper base is longer than the lower base in the cross-section of each recess) can be freely formed in the WC alloy or the like.

Furthermore, the dimensional etching limit of the fine concavo-convex pattern obtained in the mold of this embodiment largely depends upon the lithography technique employed for forming the resist pattern, and currently, the substance can be etched by the minimum dimension of approximately 50 nm. Also, the mold of this embodiment can be used in various applications ranging from fabrication of an optical circuit component with a large processing dimension to nano-imprint where the minimum dimension is pursued. Moreover, since the mold of this embodiment has the etched cross-section in a vertical shape or a downward tapered shape free from bowing, a material onto which the concavo-convex pattern is transferred is not clogged up in recesses of the mold. Then, the mold can be easily peeled off after the transfer. Furthermore, in order to increase the use durability of the mold of this embodiment by more definitely preventing the clogging of the mold, the fine concavo-convex surface of the mold of this embodiment is subjected to a surface treatment with a metal, Teflon-coating, a silicon coupling agent or the like. The material used in such a surface treatment is arbitrarily selected in accordance with the material onto which the concavo-convex pattern is transferred by using the mold.

Although the substance including tungsten and carbon is used as the material of the surface portion of the mold in this embodiment, the same effects as those of this embodiment can be attained even when the substance further includes nitrogen. In other words, the same effects as those of this embodiment can be attained also when a WCN alloy or a WNC alloy is used.

Comparative Example

Prior to explanation of a method for fabricating a molding die according to a comparative example, its premise will now be described first.

Recently, as the spread of internet to general homes and the digitization of image media have been proceeding, gigabit-level high-speed communication infrastructures have become more important. An approach that holds promise as such a high-speed communication infrastructure is an optical communication system. In order to accomplish introduction of such a high-speed communication system into general homes or the like, a low-cost module is necessary. One of challenges required for this is to develop techniques for fabricating an optical waveguide at a low cost.

Fabrication of a waveguide substrate having an optical waveguide is made by employing a method in which through lithography and dry etching commonly used in semiconductor fabrication processes, a desired fine groove pattern is formed on a glass substrate. However, since this method requires an expensive fabrication apparatus for formation of the groove pattern on all types of glass substrates, the optical waveguide cannot be obtained at a reduced cost.

In contrast to this, conventionally, another method has been proposed in which by heat press molding, the surface of a glass substrate of a softened material is formed with: a V-shaped groove for holding an optical fiber; an optical element inserting groove orthogonal to the V-shaped groove; and an optical waveguide (see, for example, Patent Document 1). According to this method, only if a molding die (mold) for molding the waveguide substrate can be formed, heat press molding with the molding die can only be conducted to mass produce waveguide substrates of the same shape, thereby providing inexpensive waveguide substrates.

The glass molding technique mentioned above has conventionally been employed commonly as a fabrication process of a glass lens, and its molding needs to be performed at a high temperature and a high pressure. Thus, heat resistance, rigidity, and durability are demanded of the molding die to be used, so that conventionally, for example, the aforementioned molding die has generally been formed by using, as a molding material, a hard metal made of an alloy of tungsten and carbon (tungsten carbide).

In semiconductor fabrication processes, a thin film such as a tungsten carbide film or a tungsten silicide film is dry etched with an etching gas to form a fine pattern (see, for example, Patent Documents 2 and 4). In this pattern formation method, if a resist film is patterned to form an etching mask in a desired shape, then anisotropic plasma etching can be performed to provide a highly precise fine pattern in a desired shape.

In the case where the molding die of a hard metal is employed as a molding die for the glass lens shown above, since the surface of the hard metal to be etched is a simply curved surface, a machining process such as grinding with diamond can be conducted on the hard metal to fabricate the molding die easily. In the case where the waveguide substrate is desired to fabricate by such a machining process, however, it is difficult to precisely form the optical waveguide having a high-density pattern with a micron-size rectangular cross-section, and concurrently its fabrication time becomes long, which leads to a decrease in productivity and an increase in fabrication cost. To deal with this problem, a possible method offering a higher productivity is a method in which a hard metal is subjected to electric discharge machining to fabricate a molding die for the waveguide substance. Although this electric discharge machining is suitable for fabrication of a molding die for automobiles or electric appliances, however, it is difficult to precisely form a fine pattern on the hard metal.

A method in which by conventional dry etching, a fine pattern is formed on a tungsten-based material is typically employed for a thin film etching in semiconductor processes. Since a fluorine-based etching gas (for example, $CHF_3$, $CF_3$, or $SF_6$) is used as an etching gas in this etching, the etching rate of tungsten carbide becomes extremely low. However, in semiconductor processes, the etching depth in the thin film etching is as small as 1 micron or less, so that the lowness of the etching rate is almost insignificant.

However, if a hard metal is dry etched for the purpose of fabricating the aforementioned molding die for the waveguide substrate, an etching depth of the order of 10 to 100 microns is required. Therefore, when dry etching is performed at a low etching rate as shown above, the required etching time becomes too long. From the actually measured results, when a hard metal is dry etched with a fluorine-based etching gas, it is etched to a depth of approximately 1 μm for an etching time of 20 minutes. Therefore, if a desired etching depth, for example, an etching depth of 10 μm is desired to etch, an etching time is extremely long as 200 minutes is needed. This probably results from the fact that unlike etching of a typical tungsten compound, in tungsten carbide, a strong bond between tungsten and carbon makes it difficult to produce fluoride with a high vapor pressure. Accordingly, if a molding die for a waveguide substrate is fabricated by dry etching the hard metal with a fluorine-based etching gas, the productivity will be lowered seriously and the fabrication cost will be increased significantly.

Furthermore, in the case where the etching time required to reach a desired etching depth becomes extremely long as mentioned above, the temperature of the molding material made of a hard metal gradually rises with the passage of the etching time and the temperature varies unstably. This makes it difficult to control the etching amount and degrades the etching selectivity with respect to the etching mask. In addition, the shape of the etching mask is changed due to side etching. As a result, the etching accuracy becomes extremely poor, which disadvantageously makes it difficult to form a desired fine pattern shape.

Hereinafter, a molding die fabrication method according to the comparative example will be described concretely with reference to the accompanying drawings. FIGS. 8(a) to 8(c), 9(a) and 9(b) are cross-sectional views for showing procedures in the molding die fabrication method according to the comparative example.

Figure 8A:
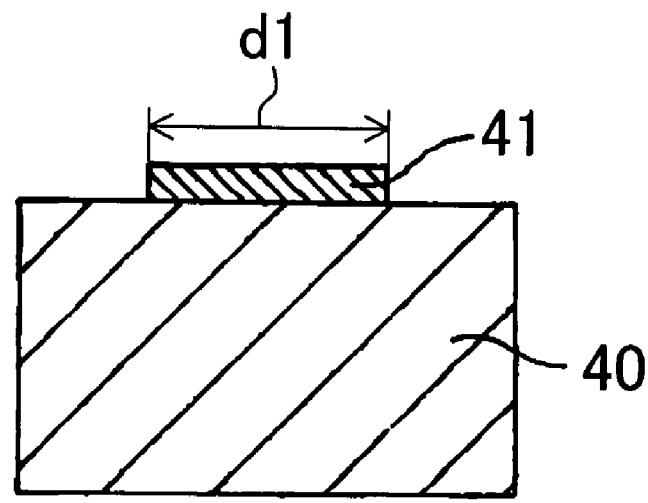
FIGS. 8(a), 8(b) and 8(c) are cross-sectional views for showing procedures in a molding die fabrication method according to a comparative example.

Referring to FIG. 8(a), first, on a molding material 40 made of a hard metal including tungsten and carbon as principal components, an etching mask 41 is formed which is made of gold, cobalt, or nickel and has a rectangular cross-section formed by a liftoff technique.

Figure 8B:
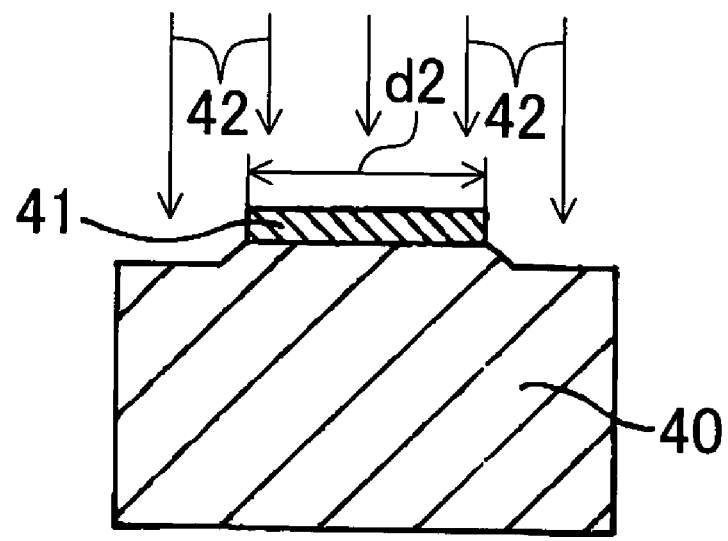

Next, as shown in FIG. 8(b), with plasma radicals 42 generated by using a fluorine-based gas as an etching gas, the molding material 40 is dry etched to a relatively small etching depth. In this etching, even though the molding material 40 is etched merely to a relatively small etching depth, it takes a long time to etch because of a low etching rate. As a result, with the passage of the long etching time, the side face of the etching mask 41 as well as the molding material 40 is gradually etched and evaporated, so that the cross-sectional width of the etching mask 41 is reduced to a width d2 smaller than the width d1 of the initial rectangular cross-section thereof shown in FIG. 8(a).

Figure 8C:
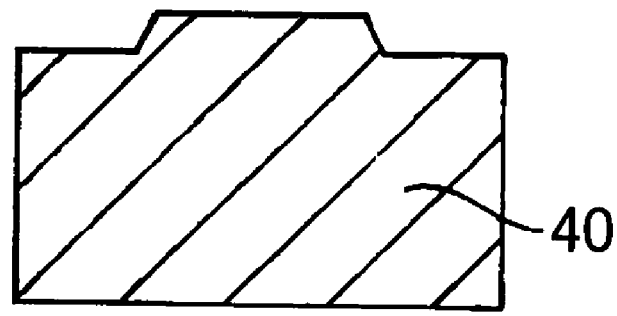

Furthermore, compounds produced by the etching adhere onto a side face of a convex portion having been formed by the etching on the molding material 40, so that the side face becomes difficult to etch. Thus, as shown in FIG. 8(c), the convex portion obtained after completion of the etching and removal of the etching mask 41 does not have a cross-section with a desired vertical side face.

Figure 9A:
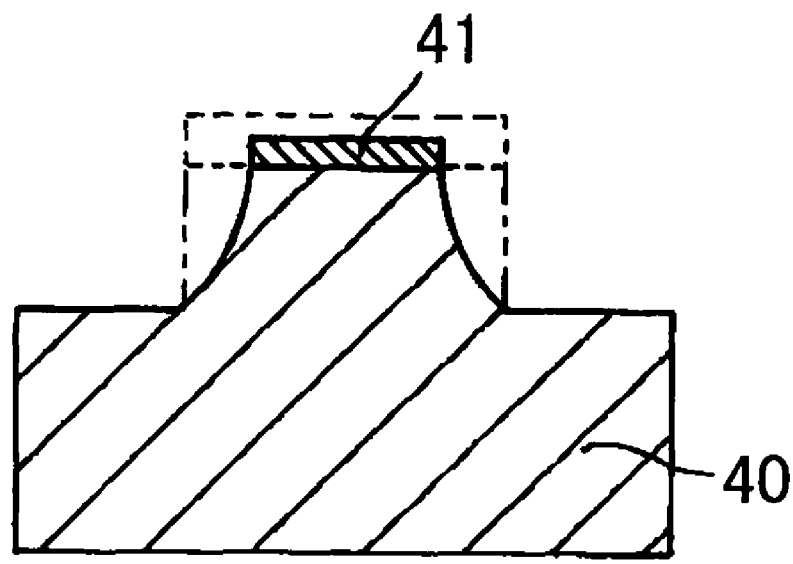
FIGS. 9(a) and 9(b) are cross-sectional views for showing procedures in the molding die fabrication method according to the comparative example.
Figure 9B:
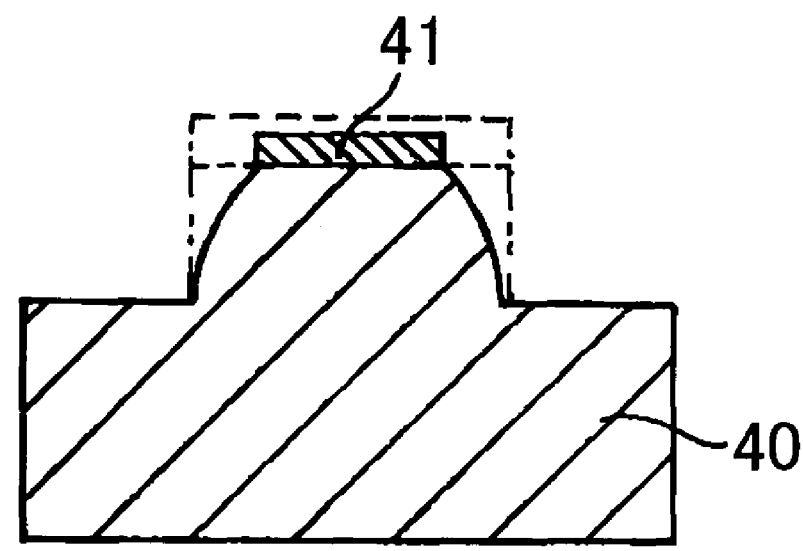

Moreover, if the dry etching on the molding material 40 is set to reach a relatively large etching depth, the etching time is further increased. With the passage of the long etching time, the etching mask 41 is gradually etched and evaporated, and thereby the cross-section of the etching mask 41 is changed from the initial rectangular shape shown by the broken lines in FIG. 9(a) or 9(b) to the shapes shown by the solid lines in these figures. In this case, as the etching time is increased, the temperature of the molding material 40 rises to make the etching rate unstable. Also, a phenomenon significantly occurs in which compounds produced by the etching adhere onto the side face being etched (the side face of the convex portion of the molding material 40) to block etching of the side face. This results in a difference in adhesion of compounds or the occurrence of side etching, which leads to an extremely poor etching selectivity with respect to the etching mask 41 and a poor mask-pattern transferability. Thus, the convex portion formed by the etching has a cross-section shape which is broadened toward the bottom as shown in FIG. 9(a) or a swollen cross-sectional shape like a drum as shown in FIG. 9(b), and it cannot have a rectangular cross-section (shown by the two-dot chain line in FIG. 9(a) or 9(b)) with a desired vertical side face.

The following molding die (mold) formation methods according to Embodiment 6 and its modifications of the invention have been made in view of the conventional problems described above, and its object is to inexpensively fabricate a molding die with high productivity, the molding die including a fine pattern of a rectangular cross-section formed with high precision on a molding material made of a hard metal including tungsten and carbon as principal components.

Embodiment 6

A molding die fabrication method according to Embodiment 6 of the invention will now be described with reference to the accompanying drawings.

Figure 10:
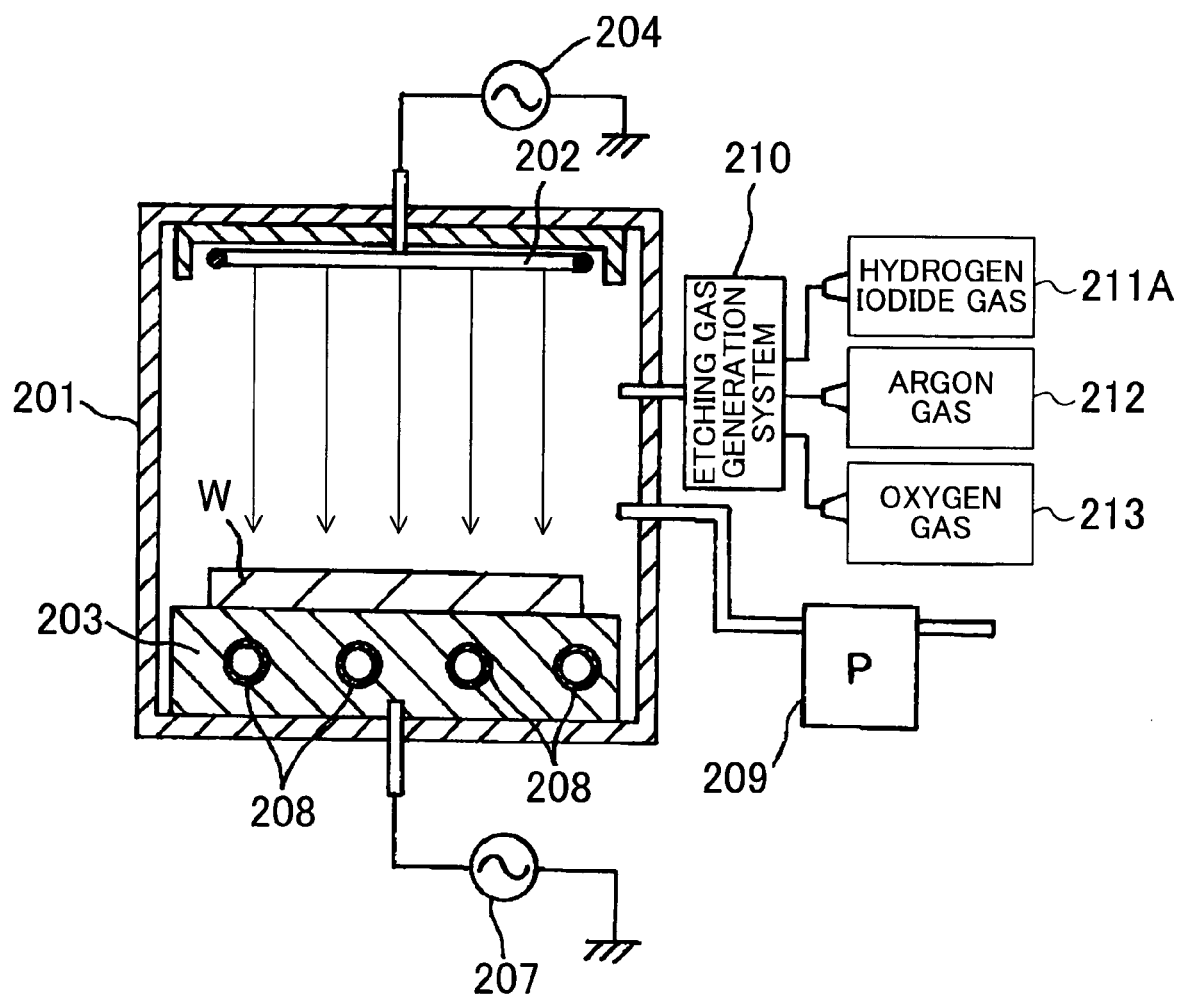
FIG. 10 is a drawing for showing a schematic cross-sectional structure of an ICP etching system for implementing a molding die fabrication method according to Embodiment 6 of the invention.

FIG. 10 is a drawing for showing a schematic cross-sectional structure of an ICP etching system for implementing the molding die fabrication method according to this embodiment. It is noted that an ICP etching system with a known structure is employed as the system of this embodiment, and by the ICP etching system, a workpiece W serving as a molding material is dry etched to form a molding die for a waveguide substrate or the like.

Referring to FIG. 10, inside a processing chamber 201 of the ICP etching system, an upper electrode 202 formed of a coil and a lower electrode 203 serving as a stage for placing a workpiece are provided to face each other. An ICP RF power source 204 is connected to the upper electrode 202, and a bias RF power source 207 is connected to the lower electrode 203. A coolant channel 208 for cooling the workpiece is provided inside the lower electrode 203. On the top surface of the lower electrode 203, the workpiece W serving as a molding material for a molding die to be formed is placed in aligned relation. The workpiece W is made of a hard metal formed by sintering an alloy composed of tungsten and carbon at a high temperature and a high pressure, and contains, as a binder, for example, several to a dozen or so at % metal such as cobalt. It is noted that as the workpiece W, use can also be made of a hard metal obtained by plasma sintering and hardly containing a binder.

In the processing chamber 201 mentioned above, a vacuum pump 209 is driven to exhaust an internal air or an etching gas remaining after etching and to evacuate the chamber to a predetermined degree of vacuum, and a new etching gas is introduced into the inside thereof. The etching gas generation system 210 for generating an etching gas introduces a hydrogen iodide gas serving as a reactive gas from a first gas tank 211A, an argon gas serving as an inactive gas from a second gas tank 212, and an oxygen gas from a third gas tank 213 so that these gases are adjusted to have flow rates in a predetermined ratio (mixing ratio) that will be described below. The three types of gases introduced are mixed to produce a desired etching gas, and the produced etching gas is then supplied to the inside of the processing chamber 201.

Figure 11A:
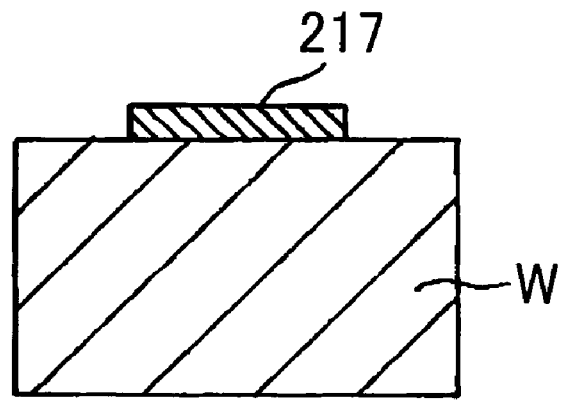
FIGS. 11(a), 11(b) and 11(c) are cross-sectional views for showing procedures in the molding die fabrication method according to Embodiment 6 and its modifications of the invention.
Figure 11B:
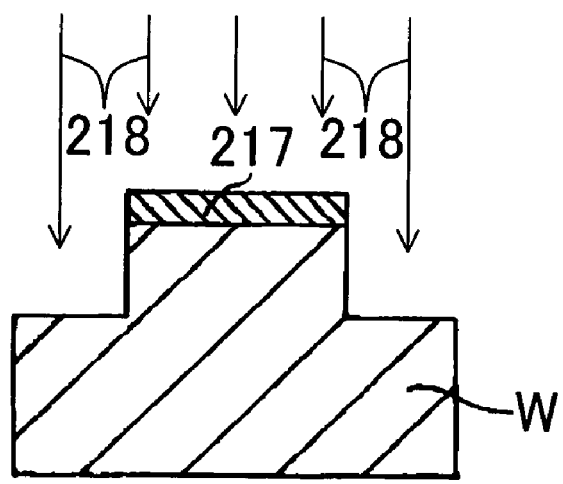
Figure 11C:
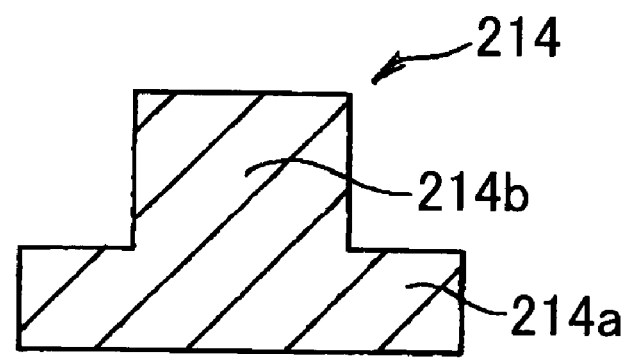
Figure 12:
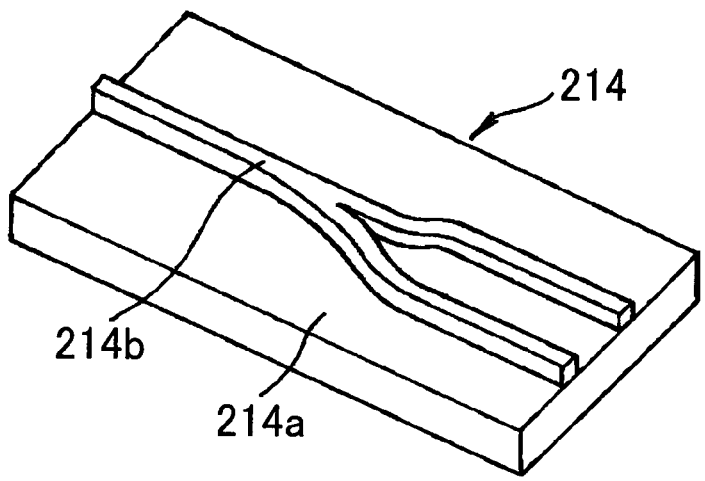
FIG. 12 is a perspective view for showing a molding die to be fabricated by the molding die fabrication method according to Embodiment 6 and its modifications of the invention.

Next description will be made of a method for fabricating a desired molding die by dry etching the aforementioned workpiece W. FIGS. 11(a) to 11(c) are cross-sectional views for showing procedures in the molding die fabrication method according to this embodiment. FIG. 12 is a perspective view for showing a molding die 214 to be fabricated by the plasma etching system described above. Referring to FIG. 12, in the molding die 214, the surface of a base 214a is formed with a rail-shaped convex portion 214b in a predetermined pattern having a rectangular cross-section. The portion 214b is made in order to form, by heat press molding, an optical fiber holding groove of a waveguide substrate. It is noted that FIG. 12 is a simplified view showing the structure of the molding die, but the rail-shaped convex portion 214b is actually formed in a fine pattern.

In the molding die fabrication method according to this embodiment, first, prior to loading of the workpiece W into the processing chamber 201, an etching mask 217 having a shape associated with the rail-shaped convex portion 214b is formed in advance on the workpiece W as shown in FIG. 11(a). The formation method of the etching mask 217 is, for example, as follows. To be more specific, a resist having an inverted pattern of a desired rail-shaped convex pattern is formed on the surface of the workpiece W, and then by a sputtering method, nickel in a film form is deposited on the entire surface of the workpiece W. Thereafter, the resist and an unwanted portion of the nickel deposited on the resist are removed by a liftoff method to form the etching mask 217 made of nickel or the like. In this embodiment, the etching mask 217 is formed in a predetermined fine pattern in which 5 μm-wide, 2 μm-thick strips are arranged at high density.

Subsequently, the workpiece W having been thus formed in advance with the etching mask 217 of a predetermined pattern is placed on the lower electrode 203 inside the processing chamber 201, and then the vacuum pump 209 is driven to evacuate the inside of the processing chamber 201 to a predetermined degree of vacuum. Thereafter, the etching gas generation system 210 is actuated to introduce an etching gas into the inside of the processing chamber 201. This etching gas is made by mixing a hydrogen iodide gas, an argon gas, and an oxygen gas as mentioned above, and the ratio of the respective gas flow rates per minute is set at a mixing ratio of, for example, hydrogen iodide gas: argon gas: oxygen gas=25 cc: 50 cc: 5 cc.

Next, a driving power is supplied from the ICP RF power source 204 to the upper electrode 202 and from the bias RF power source 207 to the lower electrode 203. This excites the etching gas inside the processing chamber 201 to generate high-density plasma radicals around the upper electrode 202 (ICP area). Therefore, as shown in FIG. 11(b), plasma radicals 218 attracted from the upper electrode 202 to the lower electrode 203 vertically enter the surface of the workpiece W including the etching mask 217, whereby dry etching of the workpiece W proceeds.

In this embodiment, as the condition of the dry etching, the power supplied from the ICP RF power source 204 to the upper electrode 202 is set at 500 W, the power supplied from the bias RF power source 207 to the lower electrode 203 is set at 300 W, the pressure inside the processing chamber 201 is set at 2 Pa, the set temperature for cooling of the workpiece W by the coolant channel 208 is set at 25° C., and the etching time is set at 20 minutes.

In this embodiment, the dry etching proceeds in the manner in which a reactive radical generated from a hydrogen iodide gas serving as a reactive gas in the etching gas acts on the surface of the workpiece W, that is, the surface of an alloy including tungsten and carbon to produce iodide of tungsten and iodide of carbon, and these iodides produced are removed. During this etching, an argon gas serving as an inactive gas in the etching gas functions to promote the etching by removing an etching compound generated on the surface being etched.

Then, when the etching is finished, the etching mask 217 is removed by wet etching with an acid such as hydrochloric acid or nitric acid. Thus, a desired molding die 214 as shown in FIGS. 11(c) and 12, that is, the molding die 214 having the rail-shaped convex portion 214b in a predetermined pattern formed on the surface of the base 214a is obtained.

In fabrication of the molding die 214 by the dry etching shown in FIG. 11(b), a hydrogen iodide gas is used as an reactive gas in the etching gas, whereby the etching rate increases to approximately 200 nm per minute. Specifically, as compared with the etching rate of the conventional dry etching with a fluorine-based gas, which is 1 μm for 20 minutes, the etching rate obtained in this embodiment is approximately 4 μm for 20 minutes, which is improved exceptionally. Moreover, in this embodiment, mixing of an oxygen gas in the etching gas further improves the etching rate. This is because a reactive radical produced from the etching gas including an oxygen gas bonds to carbon in the workpiece W to produce oxygen carbide and thereby an etching reaction is promoted.

Figure 13:
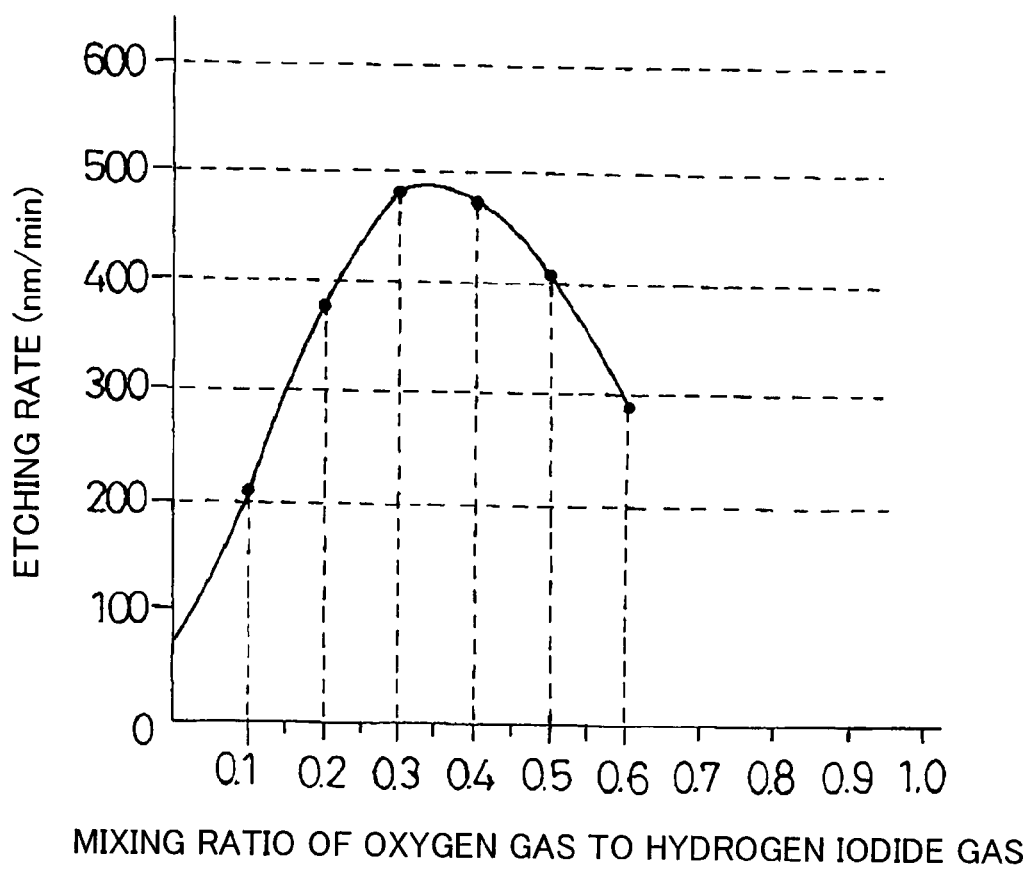
FIG. 13 is a graph for showing the relation between the mixing ratio of an oxygen gas to a hydrogen iodide gas in an etching gas and the etching rate in the molding die fabrication method according to Embodiment 6 of the invention.

In this embodiment, in the case where an oxygen gas is mixed into the etching gas, the etching rate depends, as shown in FIG. 13, on the mixing ratio (flow rate ratio) of an oxygen gas to a hydrogen iodide gas. To be more specific, in the case where the mixing ratio of an oxygen gas to a hydrogen iodide gas is set within the range of 0.15 to 0.6, an etching rate as high as about 300 nm or more per minute can be obtained. In the case where the mixing ratio is set at 0.3, a maximum etching rate of about 500 nm per minute can be obtained. Therefore, when the mixing ratio is set at 0.3, etching can be performed for 20 minutes to reach a depth of about 10 μm. On the other hand, in the conventional dry etching using a fluorine-based gas as an etching gas, an etching time as long as 200 minutes is required to perform etching to reach a depth of 10 μm. Accordingly, with this embodiment, the etching time required to reach a desired depth can be reduced much significantly as compared with that of the conventional technique.

As described above, in the dry etching of this embodiment, even though the etching depth is set at a relatively large value of approximately 10 μm, use of an etching gas made by mixing an oxygen gas into a hydrogen iodide gas dramatically improves the etching rate as mentioned above. This prevents a change in the shape of the etching mask 217 caused by side etching resulting from an increased etching time. Therefore, the initial shape of the etching mask 217 in a rectangular cross-section can be maintained. Furthermore, the etching processing can be completed within a short etching time in order to keep the amount of an etching compound to be produced from increasing. Moreover, an argon gas mixed as an inactive gas in the etching gas can effectively remove, by sputtering, an etching compound generated on the surface of the workpiece W in accordance with the etching.

In the molding die 214 fabricated by the dry etching of this embodiment, the rail-shaped convex portion 214b formed on the base 214a has a relatively great height of approximately 10 μm as shown in FIG. 11(c) and is formed in high-density pattern. In spite of this characteristic, the side face of the rail-shaped convex portion 214b is exactly perpendicular to the base 214a. That is to say, the rail-shaped convex portion 214b is formed to have a desired rectangular cross-section. Moreover, the aforementioned removal of an etching compound by an argon gas decreases the roughness of the surface being etched, so that the shape of the rail-shaped convex portion 214b can be controlled with high precision. Furthermore, with the dry etching of this modification, the etching time is significantly reduced. Thereby, the molding die 214 can be fabricated with high productivity and thus the fabrication cost thereof can be reduced.

In this embodiment, a hydrogen iodide gas is used as a reactive gas including an iodine atom. Instead of this, or in addition to this, an adequate amount of trifluoroiodomethane may be used. Alternatively, another easily-gasified iodide may be used instead. As an inactive gas, another inactive gas such as neon may be used instead of an argon gas exemplified in this embodiment. Not only the inactive gas but also a gas such as nitrogen may be further added. Moreover, as the etching mask 217, the mask made of nickel has been exemplified in this embodiment. Instead of this, the etching mask may be formed of another metal resistant to etching, such as cobalt or copper.

Hereinafter, description will be made of a method for fabricating, by heat press molding, a waveguide substrate by using the molding die 214 in which the rail-shaped convex portion 214b of a desired rectangular cross-section is formed at high density and with high precision.

Figure 14:
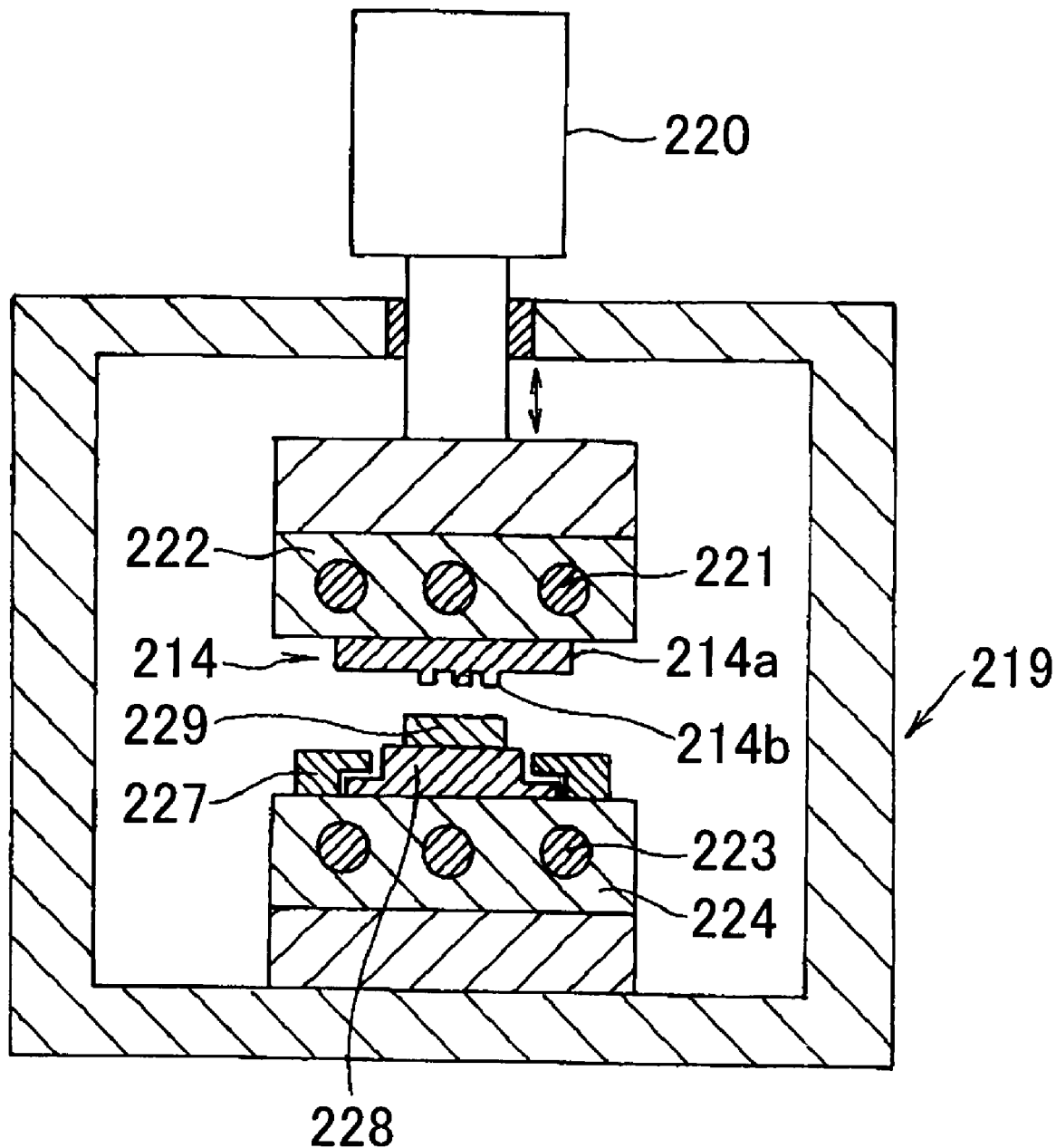
FIG. 14 shows a schematic cross-sectional structure of a heat press molding machine for fabricating a waveguide substrate by using a molding die fabricated by the molding die fabrication method according to Embodiment 6 and its modifications of the invention.

FIG. 14 shows a schematic cross-sectional structure of a heat press molding machine for fabricating a waveguide substrate. Referring to FIG. 14, a ceiling portion of a heat press molding machine 219 is provided with a pneumatic cylinder 220, and an upper press head 222 with a heater 221 for heating contained therein is mounted onto the bottom end of the pneumatic cylinder 220. On the bottom surface of the upper press head 222, the molding die 214 fabricated by the dry etching of this embodiment is firmly fixed as an upper molding die so that the rail-shaped convex portion 214b faces downward.

On the other hand, in a lower part of the inside of the heat press molding machine 219, a lower press head 224 is disposed which has a heater 223 for heating contained therein. Onto the top surface of the lower press head 224, a holding die 228 is fixedly mounted within a guide member 227 in aligned relation, and a molding material 229 made of a softened material is placed on the top surface of the holding die 228.

In the heat press molding machine 219, the molding material 229 is placed on the holding die 228, and then the inside atmosphere thereof is substituted with a nitrogen atmosphere. Subsequently to this, the heaters 221 and 223 are driven to heat the inside to a desired temperature, for example, 450 to 630° C. In this state, the pneumatic cylinder 220 is actuated to move down the upper press head 222, so that the molding die 214 firmly fixed onto the bottom surface of the upper press head 222 is pressed at a predetermined pressure against the molding material 229. With this press, the surface of the molding material 229 is formed, by plastic deformation, with a groove corresponding to the rail-shaped convex portion 214b of the molding die 214. When fabrication of a waveguide substrate made by forming the groove on the molding material 229 is thus completed, the inside of the heat press molding machine 219 is cooled to a temperature ranging from ambient temperature to 150° C. Thereafter, the finished waveguide substrate is taken from the heat press molding machine 219. As is apparent from the above, only if the molding die 214 can be processed with high precision through the fabrication method of this embodiment, heat press molding with this molding die 214 can only be performed to mass-produce waveguide substrates having the same shape. Therefore, an inexpensive waveguide substrate can be provided.

Figure 15A:
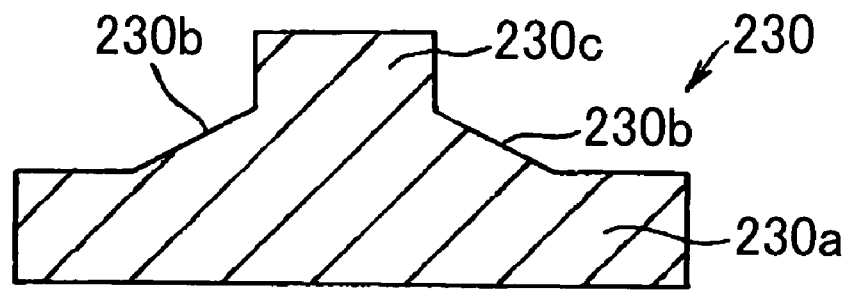
FIG. 15(a) is a view for showing another example of a cross-sectional structure of a molding die fabricated by the molding die fabrication method according to Embodiment 6 and its modifications of the invention.

In the dry etching method of this embodiment employed for fabrication of the molding die 214, a hard metal including tungsten and carbon as principal components can be dry etched at an extremely high etching rate, and also the etching selectivity with respect to the etching mask is highly improved. Therefore, for example, a molding die 230 having a cross-section as shown in FIG. 15(a) can also be formed with high precision. Referring to FIG. 15(a), in the molding die 230, a rail-shaped convex portion 230c having inclined side faces 230b on the both sides is formed on a base 230a.

Figure 15B:
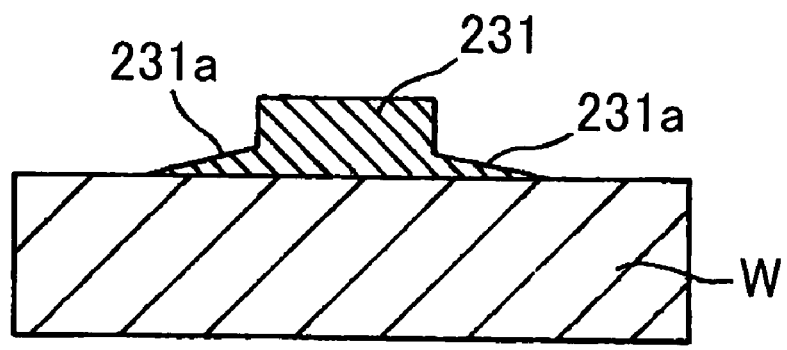
FIGS. 15(b) and 15(c) are cross-sectional views for showing fabrication procedures of the molding die in FIG. 15(a).
Figure 15C:
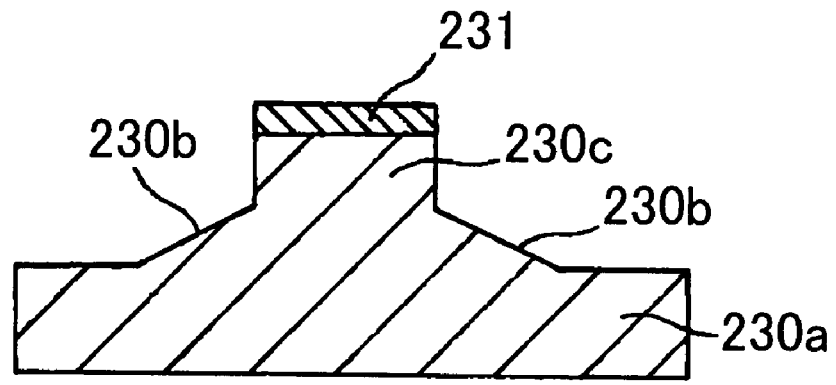

In fabricating the molding die 230, for example, as shown in FIG. 15(b), the surface of the workpiece W that will be formed into the molding die 230 is formed with an etching mask 231 having a shape associated with the inclined side faces 230b and the rail-shaped convex portion 230c to be formed. At this point, both inclined portions 231a serving as both side faces of the etching mask 231 are set to have a predetermined thickness in consideration of the preset etching time. With this structure, the bottom ends (tips) of the inclined portions 231a of the etching mask 231 is removed through etching before the expiration of a predetermined time for which the rail-shaped convex portion 230c is formed at the center portion of the workpiece W. Thereafter, at the time of completion of formation of the rail-shaped convex portion 230c, the inclined portions 231a are fully removed through etching. As a result, after completion of the etching, only a portion of the etching mask 231 used for forming the rail-shaped convex portion 230c remains as shown in, for example, FIG. 15(c). As the inclined portions 231a of the etching mask 231 are gradually etched and removed from their bottom ends, the inclined side faces 230b are formed on the workpiece W. As a result, the molding die 230 with the cross-section shown in FIG. 15(a) can be provided.

As described above, with the molding die fabrication method employing the dry etching according to this embodiment, a hard metal can be dry etched at a high etching rate. Therefore, in addition to the aforementioned fabrication of the molding die 214 for use in heat press molding of the waveguide substrate, this method can be applied suitably to fabrication of a molding die for glass molding, or a molding die for a fine tool with high strength, a fine tool with high abrasion resistance, a fine tool with high corrosion resistance, a fine tool with high heat resistance, or the like.

First Modification of Embodiment 6

A molding die fabrication method according to a first modification of Embodiment 6 of the invention will now be described with reference to the accompanying drawings.

Figure 16:
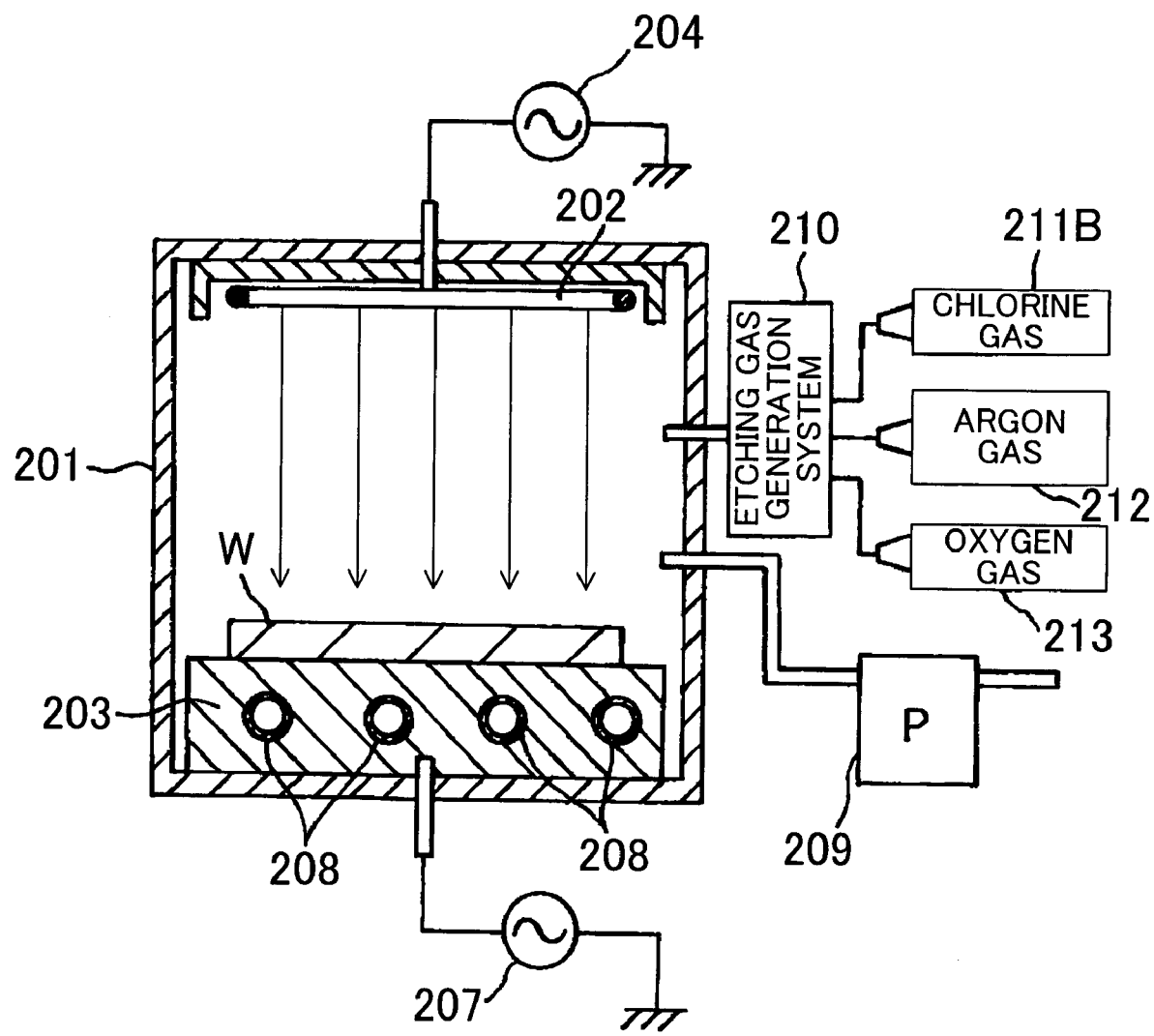
FIG. 16 is a drawing for showing a schematic cross-sectional structure of an ICP etching system for implementing a molding die fabrication method according to a first modification of Embodiment 6 of the invention.

FIG. 16 is a drawing for showing a schematic cross-sectional structure of an ICP etching system for implementing the molding die fabrication method according to this modification. The description of the components shown in FIG. 16 that are the same as those of the ICP etching system in FIG. 10 used in Embodiment 6 will be omitted by retaining the same reference numerals. As shown in FIG. 16, the ICP etching system used in this modification differs from the ICP etching system in FIG. 10 used in Embodiment 6 in that instead of the first gas tank 211A for supplying a hydrogen iodide gas serving as a reactive gas, a first gas tank 211B for supplying a chlorine gas serving as a reactive gas is provided. To be more specific, in this modification, the etching gas generation system 210 for generating an etching gas introduces a chlorine gas serving as a reactive gas from the first gas tank 211B, an argon gas serving as an inactive gas from the second gas tank 212, and an oxygen gas from the third gas tank 213 so that these gases are adjusted to have flow rates with a predetermined ratio (mixing ratio) that will be described below. The three types of gases introduced are mixed to produce a desired etching gas, and the produced etching gas is then supplied to the inside of the processing chamber 201.

The molding die fabrication method of this modification is basically identical to that of Embodiment 6 shown in FIGS. 11(a) to 11(c) and 12 except that a chlorine gas is used as a reactive gas contained in an etching gas.

Specifically, in the molding die fabrication method of this modification, as in the case of Embodiment 6, first, prior to loading of the workpiece W into the processing chamber 201, the etching mask 217 having a shape associated with the rail-shaped convex portion 214b is formed in advance on the workpiece W as shown in FIG. 11(a). The formation method of the etching mask 217 is, for example, identical to that of Embodiment 6.

Subsequently, the workpiece W having been formed in advance with the etching mask 217 of a predetermined pattern is placed on the lower electrode 203 inside the processing chamber 201, and then the vacuum pump 209 is driven to evacuate the inside of the processing chamber 201 to a predetermined degree of vacuum. Thereafter, the etching gas generation system 210 is actuated to introduce an etching gas into the inside of the processing chamber 201. This etching gas is made by mixing a chlorine gas, an argon gas, and an oxygen gas as mentioned above, and the ratio of the respective gas flow rates per minute is set at a mixing ratio of, for example, chlorine gas: argon gas: oxygen gas=25 cc: 50 cc: 5 cc.

Next, like Embodiment 6, a driving power is supplied from the ICP RF power source 204 to the upper electrode 202 and from the bias RF power source 207 to the lower electrode 203. This excites the etching gas inside the processing chamber 201 to generate high-density plasma radicals around the upper electrode 202 (ICP area). Therefore, as shown in FIG. 11(b), plasma radicals 218 attracted from the upper electrode 202 to the lower electrode 203 vertically enter the surface of the workpiece W including the etching mask 217, whereby dry etching of the workpiece W proceeds.

The dry etching condition employed in this modification is, for example, identical to that employed in Embodiment 6.

In this modification, the dry etching proceeds in the manner in which a reactive radical generated from a chlorine gas serving as a reactive gas in the etching gas acts on the surface of the workpiece W, that is, the surface of an alloy including tungsten and carbon to produce chloride of tungsten and chloride of carbon, and these chlorides produced are removed. During this etching, an argon gas serving as an inactive gas in the etching gas functions to promote the etching by removing an etching compound generated on the surface being etched.

Then, when the etching is finished, the etching mask 217 is removed by wet etching with an acid such as hydrochloric acid or nitric acid as in the case of Embodiment 6. Thus, a desired molding die 214 as shown in FIGS. 11(c) and 12, that is, the molding die 214 having the rail-shaped convex portion 214b in a predetermined pattern formed on the surface of the base 214a is obtained.

In fabrication of the molding die 214 by the dry etching shown in FIG. 11(b), a chlorine gas is used as a reactive gas in the etching gas, whereby the etching rate increases to approximately 200 nm per minute. Specifically, as compared with the etching rate of the conventional dry etching with a fluorine-based gas, which is 1 μm for 20 minutes, the etching rate in this modification is approximately 4 μm for 20 minutes, which is improved exceptionally. Moreover, in this modification, mixing of an oxygen gas in the etching gas further improves the etching rate. This is because a reactive radical produced from the etching gas including an oxygen gas bonds to carbon in the workpiece W to produce oxygen carbide and thereby an etching reaction is promoted.

Figure 17:
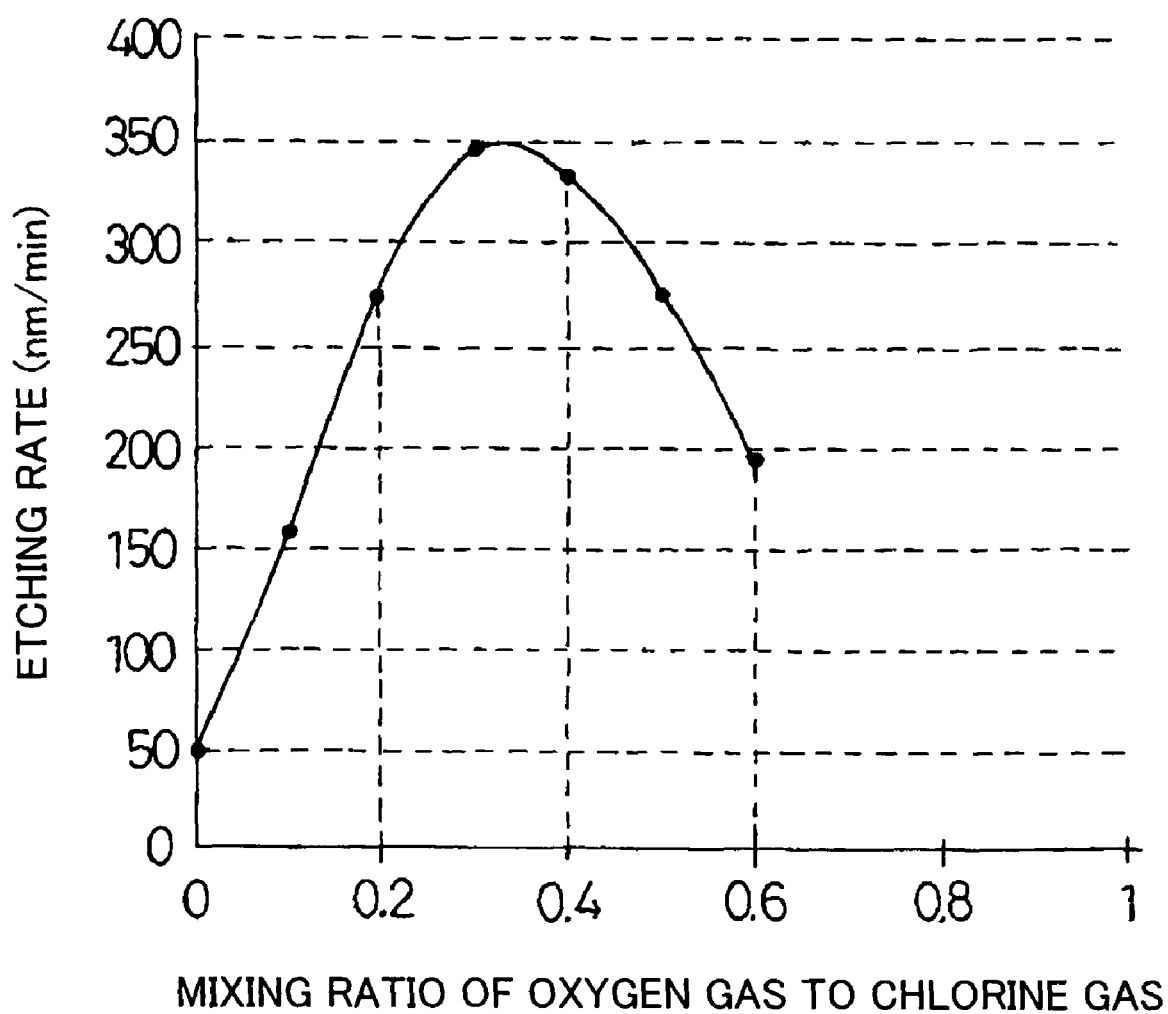
FIG. 17 is a graph for showing the relation between the mixing ratio of an oxygen gas to a chlorine gas in an etching gas and the etching rate in the molding die fabrication method according to the first modification of Embodiment 6 of the invention.

In this modification, in the case where an oxygen gas is mixed into the etching gas, the etching rate depends, as shown in FIG. 17, on the mixing ratio (flow rate ratio) of an oxygen gas to a chlorine gas. To be more specific, in the case where the mixing ratio of an oxygen gas to a chlorine gas is set within the range of 0.15 to 0.6, an etching rate as high as about 150 to 200 nm or more per minute can be obtained. In the case where the mixing ratio is set at 0.3, a maximum etching rate of about 350 nm per minute can be obtained. Therefore, when the mixing ratio is set at 0.3, etching can be performed for 20 minutes to reach a depth of about 7 μm. On the other hand, in the conventional dry etching using a fluorine-based gas as an etching gas, an etching time as long as 200 minutes is required to perform etching to reach a depth of 10 μm. Accordingly, with this modification, the etching time required to reach a desired depth can be reduced much significantly as compared with that of the conventional technique.

As described above, in the dry etching of this modification, even though the etching depth is set at a relatively large value of approximately 10 μm, use of an etching gas made by mixing an oxygen gas into a chlorine gas dramatically improves the etching rate as mentioned above. This prevents a change in the shape of the etching mask 217 caused by side etching resulting from an increased etching time. Therefore, the initial shape of the etching mask 217 in a rectangular cross-section can be maintained. Furthermore, the etching processing can be completed within a short etching time in order to keep the amount of an etching compound to be produced from increasing. Moreover, an argon gas mixed as an inactive gas in the etching gas can effectively remove, by sputtering, an etching compound generated on the surface of the workpiece W in accordance with the etching.

In the molding die 214 obtained by the dry etching of this modification, like Embodiment 6, the rail-shaped convex portion 214*b* formed on the base 214*a* has a relatively great height of approximately 10 μm as shown FIG. 11(*c*) and is formed in a high-density pattern. In spite of this characteristic, the side face of the rail-shaped convex portion 214*b* is exactly perpendicular to the base 214*a*. That is to say, the rail-shaped convex portion 214*b* is formed to have a desired rectangular cross-section. Moreover, the aforementioned removal of an etching compound by an argon gas decreases the roughness of the etched surface, so that the shape of the rail-shaped convex portion 214*b* can be controlled with high precision. Furthermore, with the dry etching of this modification, the etching time is significantly reduced. Thereby, the molding die 214 can be fabricated with high productivity and thus the fabrication cost thereof can be reduced.

In this modification, a chlorine gas is used as a reactive gas including a chlorine atom. Instead of this, or in addition to this, an adequate amount of boron trichloride, carbon tetrachloride, or chloroform may be used. Alternatively, another easily-gasified chloride may be used instead. As an inactive gas, another inactive gas such as neon may be used instead of an argon gas exemplified in this modification. Not only the inactive gas but also a gas such as nitrogen may be further added. Moreover, as the etching mask 217, the mask made of nickel has been exemplified in this modification. Instead of this, the etching mask may be formed of another metal resistant to etching, such as cobalt or copper.

A method for fabricating, by heat press molding, a waveguide substrate by using the molding die 214 in which the rail-shaped convex portion 214*b* of a desired rectangular cross-section is formed, as mentioned above, at high density and with high precision is identical to that of Embodiment 6 shown in FIGS. 14 and 15(*a*) to 15(*c*).

Second Modification of Embodiment 6

A molding die fabrication method according to a second modification of Embodiment 6 of the invention will now be described with reference to the accompanying drawings.

Figure 18:
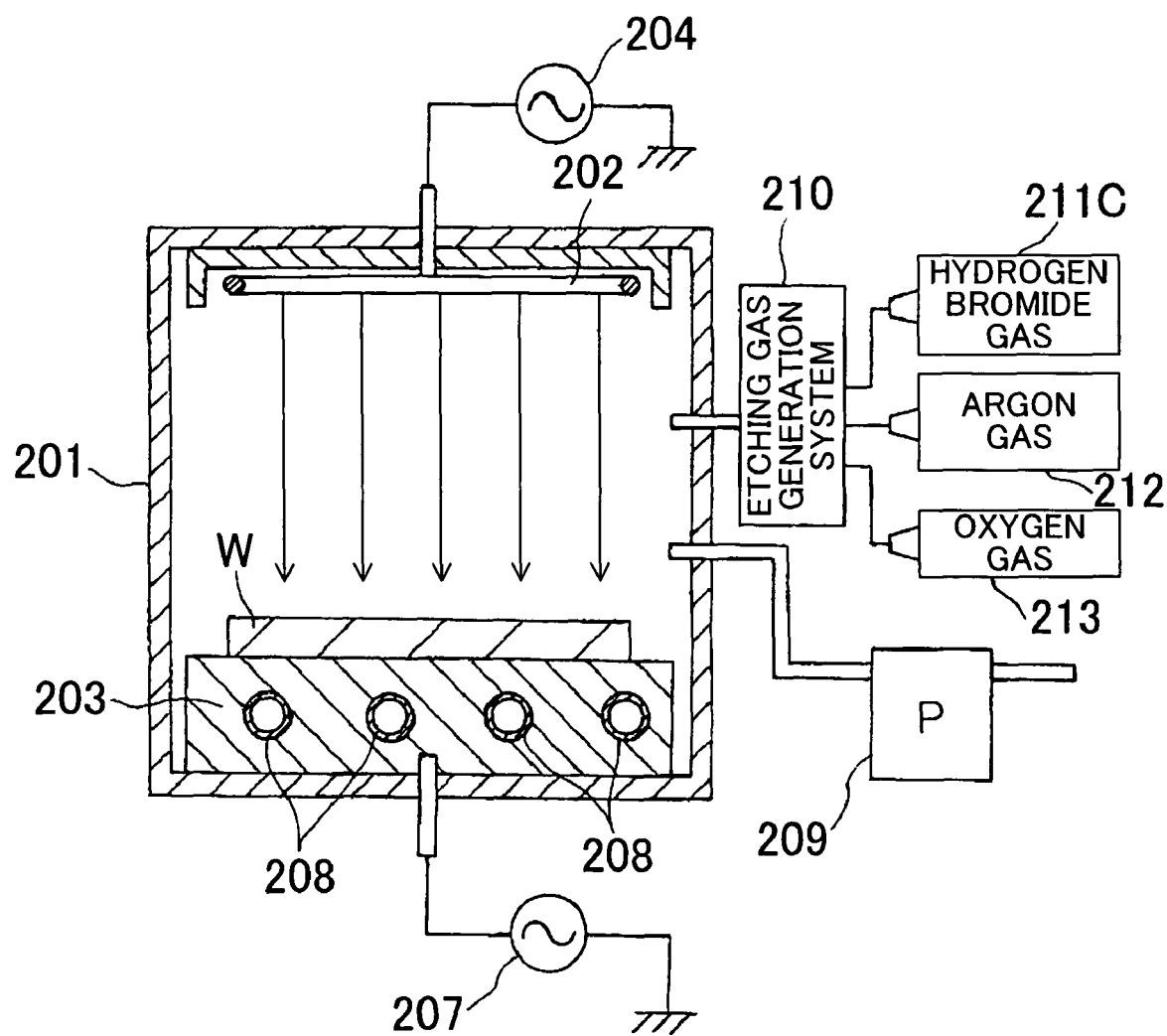
FIG. 18 is a drawing for showing a schematic cross-sectional structure of an ICP etching system for implementing a molding die fabrication method according to a second modification of Embodiment 6 of the invention.

FIG. 18 is a drawing for showing a schematic cross-sectional structure of an ICP etching system for implementing the molding die fabrication method according to this modification. The description of the components shown in FIG. 18 that are the same as those of the ICP etching system in FIG. 10 used in Embodiment 6 will be omitted by retaining the same reference numerals. As shown in FIG. 18, the ICP etching system used in this modification differs from the ICP etching system in FIG. 10 used in Embodiment 6 in that instead of the first gas tank 211A for supplying a hydrogen iodide gas serving as a reactive gas, a first gas tank 211C for supplying a hydrogen bromide gas serving as a reactive gas is provided. To be more specific, in this modification, the etching gas generation system 210 for generating an etching gas introduces a hydrogen bromide gas serving as a reactive gas from the first gas tank 211C, an argon gas serving as an inactive gas from the second gas tank 212, and an oxygen gas from the third gas tank 213 so that these gases are adjusted to have flow rates with a predetermined ratio (mixing ratio) that will be described below. The three types of gases introduced are mixed to produce a desired etching gas, and the produced etching gas is then supplied to the inside of the processing chamber 201.

The molding die fabrication method of this modification is basically identical to that of Embodiment 6 shown in FIGS. 11(*a*) to 11(*c*) and 12 except that a hydrogen bromide gas is used as a reactive gas contained in an etching gas.

Specifically, in the molding die fabrication method of this modification, as in the case of Embodiment 6, first, prior to loading of the workpiece W into the processing chamber 201, the etching mask 217 having a shape associated with the rail-shaped convex portion 214*b* is formed in advance on the workpiece W as shown in FIG. 11(*a*). The formation method of the etching mask 217 is, for example, identical to that of Embodiment 6.

Subsequently, the workpiece W having been formed in advance with the etching mask 217 of a predetermined pattern is placed on the lower electrode 203 inside the processing chamber 201, and then the vacuum pump 209 is driven to evacuate the inside of the processing chamber 201 to a predetermined degree of vacuum. Thereafter, the etching gas generation system 210 is actuated to introduce an etching gas into the inside of the processing chamber 201. This etching gas is made by mixing a hydrogen bromide gas, an argon gas, and an oxygen gas as mentioned above, and the ratio of the respective gas flow rates per minute is set at a mixing ratio of, for example, hydrogen bromide gas: argon gas: oxygen gas=25 cc: 50 cc: 5 cc.

Next, like Embodiment 6, a driving power is supplied from the ICP RF power source 204 to the upper electrode 202 and from the bias RF power source 207 to the lower electrode 203. This excites the etching gas inside the processing chamber 201 to generate high-density plasma radicals around the upper electrode 202 (ICP area). Therefore, as shown in FIG. 11(*b*), plasma radicals 218 attracted from the upper electrode 202 to the lower electrode 203 vertically enter the surface of the workpiece W including the etching mask 217, whereby dry etching of the workpiece W proceeds.

The dry etching condition employed in this modification is, for example, identical to that employed in Embodiment 6.

In this modification, the dry etching proceeds in the manner in which a reactive radical generated from a hydrogen bromide gas serving as a reactive gas in the etching gas acts on the surface of the workpiece W, that is, the surface of an alloy including tungsten and carbon to produce bromide of tungsten and bromide of carbon, and these bromides produced are removed. During this etching, an argon gas serving as an inactive gas in the etching gas functions to promote the etching by removing an etching compound generated on the surface being etched.

Then, when the etching is finished, the etching mask 217 is removed by wet etching with an acid such as hydrochloric acid or nitric acid as in the case of Embodiment 6. Thus, a desired molding die 214 as shown in FIGS. 11(*c*) and 12, that is, the molding die 214 having the rail-shaped convex portion 214*b* in a predetermined pattern formed on the surface of the base 214*a* is obtained.

In fabrication of the molding die 214 by the dry etching shown in FIG. 11(*b*), a hydrogen bromide gas is used as a reactive gas in the etching gas, whereby the etching rate increases to approximately 200 nm per minute. Specifically, as compared with the etching rate of the conventional dry etching with a fluorine-based gas, which is 1 μm for 20 minutes, the etching rate in this modification is approximately 4 μm for 20 minutes, which is improved exceptionally. Moreover, in this modification, mixing of an oxygen gas in the etching gas further improves the etching rate. This is because a reactive radical produced from the etching gas including an oxygen gas bonds to carbon in the workpiece W to produce oxygen carbide and thereby an etching reaction is promoted.

Figure 19:
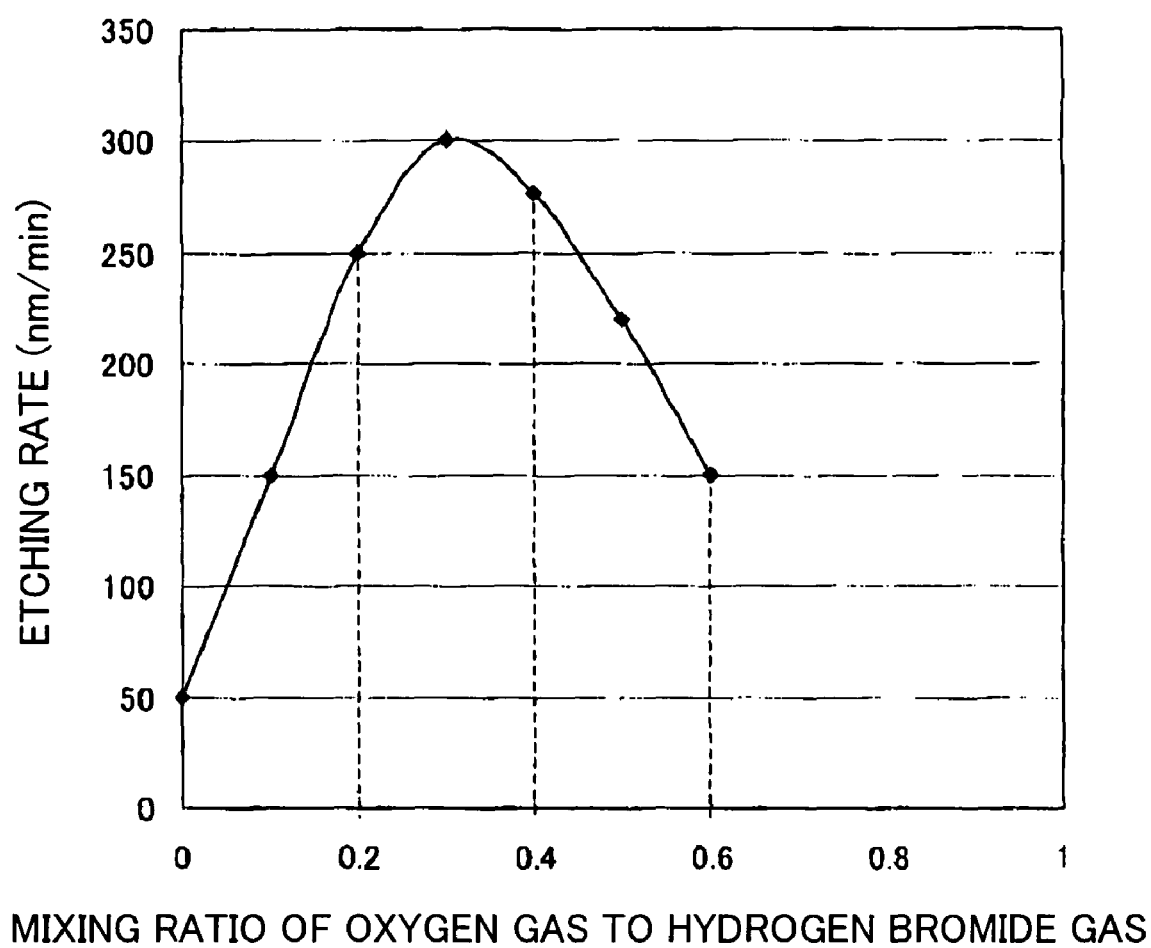
FIG. 19 is a graph for showing the relation between the mixing ratio of an oxygen gas to a hydrogen bromide gas in an etching gas and the etching rate in the molding die fabrication method according to the second modification of Embodiment 6 of the invention.

In this modification, in the case where an oxygen gas is mixed into the etching gas, the etching rate depends, as shown in FIG. 19, on the mixing ratio (flow rate ratio) of an oxygen gas to a hydrogen bromide gas. To be more specific, in the case where the mixing ratio of an oxygen gas to a hydrogen bromide gas is set within the range of 0.15 to 0.6, an etching rate as high as about 150 to 200 nm or more per minute can be obtained. In the case where the mixing ratio is set at 0.3, a maximum etching rate of about 300 nm per minute can be obtained. Therefore, when the mixing ratio is set at 0.3, etching can be performed for 20 minutes to reach a depth of about 6 μm. On the other hand, in the conventional dry etching using a fluorine-based gas as an etching gas, an etching time as long as 200 minutes is required to perform etching to reach a depth of 10 μm. Accordingly, with this modification, the etching time required to reach a desired depth can be reduced much significantly as compared with that of the conventional technique.

As described above, in the dry etching of this modification, even though the etching depth is set at a relatively large value of approximately 10 μm, use of an etching gas made by mixing an oxygen gas into a hydrogen bromide gas dramatically improves the etching rate as mentioned above. This prevents a change in the shape of the etching mask 217 caused by side etching resulting from an increased etching time. Therefore, the initial shape of the etching mask 217 in a rectangular cross-section can be maintained. Furthermore, the etching processing can be completed within a short etching time in order to keep the amount of an etching compound to be produced from increasing. Moreover, an argon gas mixed as an inactive gas in the etching gas can effectively remove, by sputtering, an etching compound generated on the surface of the workpiece W in accordance with the etching.

In the molding die 214 obtained by the dry etching of this modification, like Embodiment 6, the rail-shaped convex portion 214b formed on the base 214a has a relatively great height of approximately 10 μm as shown FIG. 11(c) and is formed in a high-density pattern. In spite of this characteristic, the side face of the rail-shaped convex portion 214b is exactly perpendicular to the base 214a. That is to say, the rail-shaped convex portion 214b is formed to have a desired rectangular shape in cross section. Moreover, the aforementioned removal of an etching compound by an argon gas decreases the roughness of the etched surface, so that the shape of the rail-shaped convex portion 214b can be controlled with high precision. Furthermore, with the dry etching of this modification, the etching time is significantly reduced. Thereby, the molding die 214 can be fabricated with high productivity and thus the fabrication cost thereof can be reduced.

In this modification, a hydrogen bromide gas is used as a reactive gas including a bromine atom. Instead of this, or in addition to this, an adequate amount of a bromine gas, boron tribromide, carbon tetrabromide, or methyl bromide may be used. Alternatively, another easily-gasified bromide may be used instead. As an inactive gas, another inactive gas such as neon may be used instead of an argon gas exemplified in this modification. Not only the inactive gas but also a gas such as nitrogen may be further added. Moreover, as the etching mask 217, a mask made of nickel has been exemplified in this modification. Instead of this, the etching mask may be formed of another metal resistant to etching, such as cobalt or copper.

A method for fabricating, by heat press molding, a waveguide substrate by using the molding die 214 in which the rail-shaped convex portion 214b of a desired rectangular cross-section is formed at high density and with high precision is identical to that of Embodiment 6 shown in figs. 14 and 15(a) to 15(c).

Industrial Applicability

As described so far, the dry etching method of this invention is useful for highly precisely microprocessing a substance including tungsten and carbon such as a WC alloy. Also, the fine structure formation method of this invention is very useful for highly precisely forming a fine pattern in a substance including tungsten and carbon such as a WC alloy. Specifically, as a technique to remarkably increase the preciseness and easiness of processing of a hard metal of a WC alloy or the like, the dry etching method and the fine structure formation method of this invention can pave the way for the use of a WC alloy or the like in the field of MEMS (micro-electro-mechanical systems).

The mold fabrication method of this invention is indispensable for fabricating a mold having a highly precise fine concavo-convex pattern by using, as a mold base material, a substance including tungsten and carbon such as a WC alloy. Also, since the mold of this invention has a structure in which a highly precise fine concavo-convex pattern is provided on a hard metal of a WC alloy or the like, it can be used not only as a mold for fabrication of an optical circuit component or a mold for nano-imprint but also as a highly durable mold having a highly precise fine concavo-convex pattern applicable in any field.

In another dry etching method and another molding die fabrication method of this invention, a molding material made of a hard metal including tungsten and carbon as principal components is dry etched with plasma radicals generated from an etching gas made by mixing a first gas including an iodine atom, a chlorine gas, or a bromine atom, a second gas made of an inactive gas, a third gas made of an oxygen gas. Thus, even if a pattern having a relatively great etching depth is formed at high density, a highly precise molding die can be fabricated which has a desired rectangular cross-section formed so that the side face of a convex portion formed through etching is exactly perpendicular to a base and which has an etched surface with a small roughness. Furthermore, with these methods, the etching time is significantly reduced. Thereby, a molding die can be fabricated with high productivity to reduce the fabrication cost thereof.

What is claimed is:

1. A dry etching method comprising the step of:
   etching a substance including tungsten and carbon by using plasma generated from a gas including chlorine, wherein
   the substance is a substrate or a layer made of a tungsten-carbon alloy or a material in which a total composition ratio of tungsten and carbon is 50 atomic % or more, and
   the gas including chlorine includes a hydrogen chloride molecule, $CClF_3$, $CCl_3F$, $CCl_2F_2$, $ICl$, $ClF_2Br$, $ClF_2I$, $BrCl$, $COCl_2$, $ClFO_3$, $NOCl$, $NO_2Cl$, $SOCl_2$, $SO_2Cl_2$, $SO_3HCl$, or a mixture of two or more thereof.

2. The dry etching method of claim 1,
   wherein the plasma is generated from a mixed gas of the gas including chlorine and an inert gas.

3. The dry etching method of claim 1,
   wherein the plasma is generated from a mixed gas of the gas including chlorine and a gas including oxygen.

4. The dry etching method of claim 3,
wherein the gas including oxygen includes an oxygen molecule, a nitrogen oxide molecule, a sulfur oxide molecule, a carbon oxide molecule, or a mixture of two or more thereof.

5. The dry etching method of claim 1,
wherein the plasma is generated from a mixed gas of the gas including chlorine and a gas including halogen other than chlorine.

6. The dry etching method of claim 5,
wherein the gas including halogen is a gas including fluorine, a gas including bromine, a gas including iodine, or a mixed gas of two or more thereof.

7. A fine structure formation method comprising the steps of:
forming a mask pattern on a substance including tungsten and carbon; and
etching, with the mask pattern used, the substance by using plasma generated from a gas including chlorine, wherein
the substance is a substrate or a layer made of a tungsten-carbon alloy or a material in which a total composition ratio of tungsten and carbon is 50 atomic % or more, and
the gas including chlorine includes a hydrogen chloride molecule, $CClF_3$, $CCl_3F$, $CCl_2F_2$, $IC_1$, $ClF_2Br$, $ClF_2I$, BrCl, $COCl_2$, $ClFO_3$, NOCl, $NO_2Cl$, $SOCl_2$, $SO_2Cl_2$, $SO_3HCl$, or a mixture of two or more thereof.

8. The fine structure formation method of claim 7,
wherein the plasma is generated from a mixed gas of the gas including chlorine and an inert gas.

9. The fine structure formation method of claim 7,
wherein the plasma is generated from a mixed gas of the gas including chlorine and a gas including oxygen.

10. The fine structure formation method of claim 9,
wherein the gas including oxygen includes an oxygen molecule, a nitrogen oxide molecule, a sulfur oxide molecule, a carbon oxide molecule, or a mixture of two or more thereof.

11. The fine structure formation method of claim 7,
wherein the plasma is generated from a mixed gas of the gas including chlorine and a gas including halogen other than chlorine.

12. The fine structure formation method of claim 11,
wherein the gas including halogen is a gas including fluorine, a gas including bromine, a gas including iodine, or a mixed gas of two or more thereof.

13. A mold fabrication method comprising the step of:
dry etching using plasma generated from a gas including chlorine, a substance including tungsten and carbon, thereby processing the substance to be a mold, wherein
the substance is a substrate or a layer made of a tungsten-carbon alloy or a material in which a total composition ratio of tungsten and carbon is 50 atomic % or more, and
the gas including chlorine includes a hydrogen chloride molecule, $CClF_3$, $CCl_3F$, $CCl_2F_2$, $IC_1$, $ClF_2Br$, $ClF_2I$, BrCl, $COCl_2$, $ClFO_3$, NOCl, $NO_2Cl$, $SOCl_2$, $SO_2Cl_2$, $SO_3HCl$, or a mixture of two or more thereof.

14. The mold fabrication method of claim 13,
wherein the plasma is generated from a mixed gas of the gas including chlorine and an inert gas.

15. The mold fabrication method of claim 13,
wherein the plasma is generated from a mixed gas of the gas including chlorine and a gas including oxygen.

16. The mold fabrication method of claim 15,
wherein the gas including oxygen includes an oxygen molecule, a nitrogen oxide molecule, a sulfur oxide molecule, a carbon oxide molecule, or a mixture of two or more thereof.

17. The mold fabrication method of claim 13,
wherein the plasma is generated from a mixed gas of the gas including chlorine and a gas including halogen other than chlorine.

18. The mold fabrication method of claim 17,
wherein the gas including halogen is a gas including fluorine, a gas including bromine, a gas including iodine, or a mixed gas of two or more thereof.

\* \* \* \* \*